(12) United States Patent
Aoki et al.

(10) Patent No.: US 8,227,851 B2
(45) Date of Patent: Jul. 24, 2012

(54) SEMICONDUCTOR DEVICE

(75) Inventors: Tomoyuki Aoki, Tochigi (JP); Koji Dairiki, Isehara (JP); Yuugo Goto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/952,766

(22) Filed: Nov. 23, 2010

(65) Prior Publication Data

US 2011/0068385 A1    Mar. 24, 2011

Related U.S. Application Data

(62) Division of application No. 11/919,635, filed as application No. PCT/JP2006/311044 on May 26, 2006, now Pat. No. 7,838,993.

(30) Foreign Application Priority Data

May 31, 2005    (JP) .................................. 2005-160735

(51) Int. Cl.
*H01L 27/112*    (2006.01)
(52) U.S. Cl. .. 257/314; 257/773; 257/730; 257/E27.102
(58) Field of Classification Search .................. 257/314, 257/773, 730, 40, E27.102
See application file for complete search history.

(56) References Cited

U.S. PATENT DOCUMENTS

| | | | |
|---|---|---|---|
| 5,444,222 A * | 8/1995 | Inoue | 235/380 |
| 6,830,193 B2 | 12/2004 | Tanaka | |
| 7,050,333 B2 | 5/2006 | Matsue | |
| 7,129,145 B2 * | 10/2006 | Kawamura et al. | 438/381 |
| 7,254,318 B2 | 8/2007 | Imada et al. | |
| 7,298,029 B2 | 11/2007 | Usami et al. | |
| 2005/0148121 A1 * | 7/2005 | Yamazaki et al. | 438/149 |

FOREIGN PATENT DOCUMENTS

| | | |
|---|---|---|
| EP | 2003-249814 | 9/2003 |
| JP | 10-256495 | 9/1998 |
| JP | 10-261055 | 9/1998 |

(Continued)

OTHER PUBLICATIONS

International Search Report (Application No. PCT/JP2006/311044) dated Sep. 19, 2006.

(Continued)

*Primary Examiner* — Thinh T Nguyen
(74) *Attorney, Agent, or Firm* — Eric J. Robinson; Robinson Intellectual Property Law Office, P.C.

(57) ABSTRACT

It is an object of the invention to provide semiconductor devices which can protect privacy of consumers or holders of commercial products and control the communication range according to use, even when the semiconductor device which can exchange data without contact is mounted on the commercial products. A semiconductor device of the invention includes an element group including a plurality of transistors over a substrate; a first conductive film functioning as an antenna over the element group; a second conductive film surrounding the first conductive film; an insulating film covering the first and second end portions; and a third conductive film over the insulating film. The first conductive film is provided in the shape of a coil, and each end portion of the first conductive film is connected to the element group. First and second end portions of the second conductive film are not connected to each other.

4 Claims, 19 Drawing Sheets

FOREIGN PATENT DOCUMENTS

| | | |
|---|---|---|
| JP | 2000-099658 | 4/2000 |
| JP | 2001-024413 | 1/2001 |
| JP | 2001-351084 | 12/2001 |
| JP | 2003-069335 | 3/2003 |
| JP | 2003-157420 | 5/2003 |
| JP | 2003-168088 | 6/2003 |
| JP | 2003-249813 | 9/2003 |
| JP | 2004-280391 | 10/2004 |
| JP | 2004-326937 | 11/2004 |
| WO | WO 03/046823 | 6/2003 |
| WO | WO 03/046914 | 6/2003 |
| WO | 1 471 538 | 10/2004 |

OTHER PUBLICATIONS

Written Opinion (Application No. PCT/JP2006/311044) dated Sep. 19, 2006.

Motohiro Tsuchiya, "Privacy of an Object—Reexamining the RFID Boycott,", Economic Review, Jul. 1, 2004, vol. 8, No. 3, pp. 4-7, Fujitsu Research Institute.

* cited by examiner

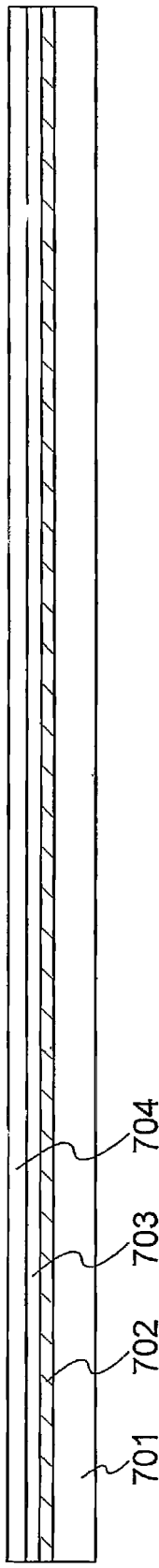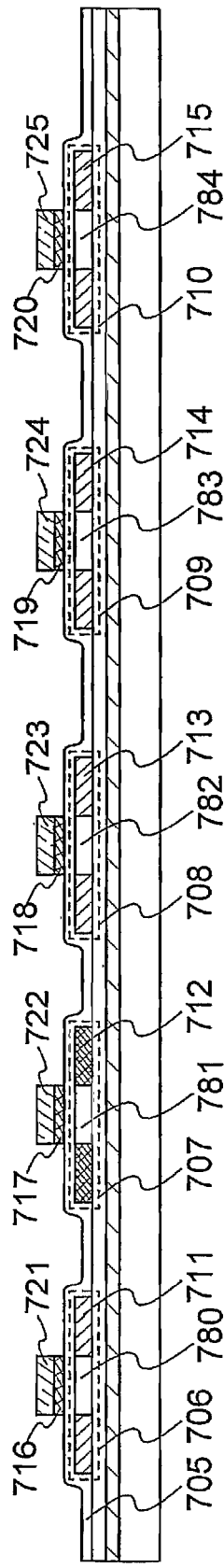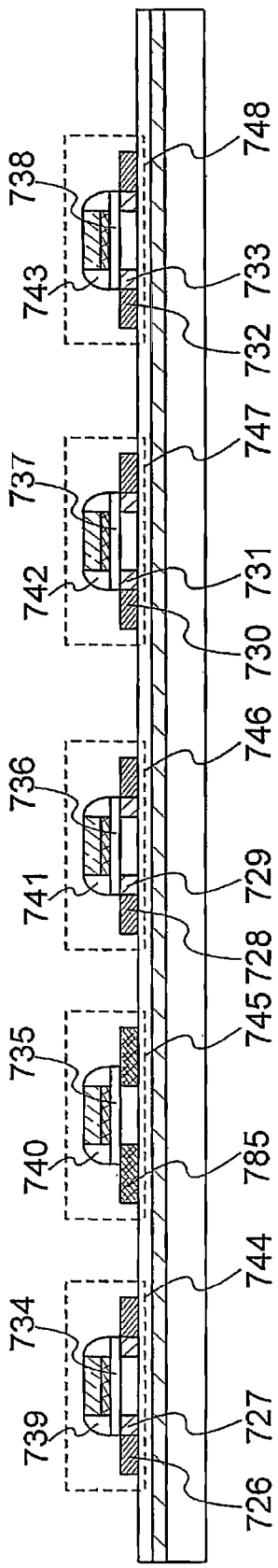

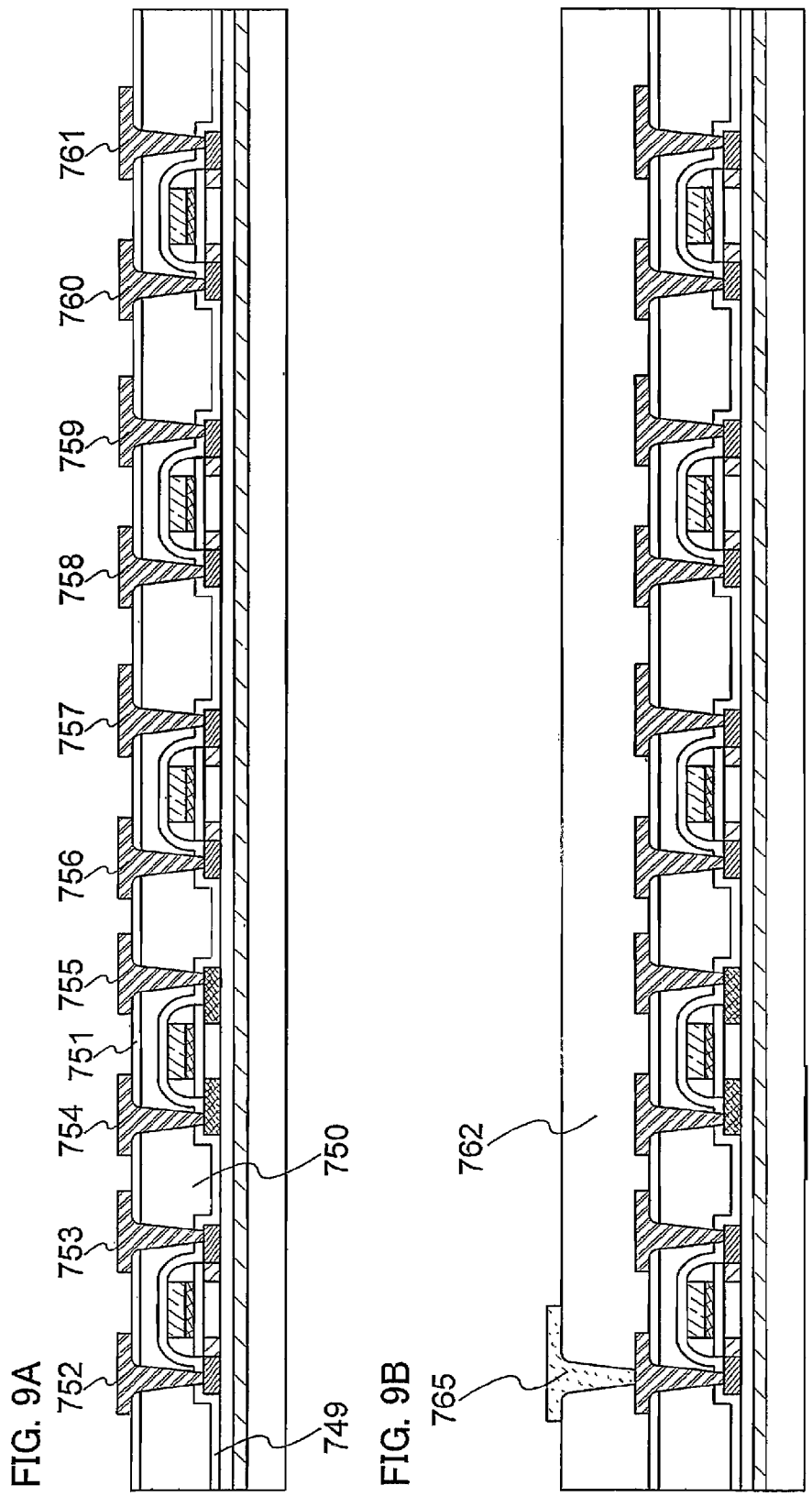

SEMICONDUCTOR DEVICE

TECHNICAL FIELD

The present invention relates to a semiconductor device which can send and receive data without contact, particularly to a semiconductor device which can change the communication range thereof.

BACKGROUND ART

In recent years, individual recognition technology which clarifies such as a history of the object by giving an ID (an individual recognition number) to each object; and is useful for production and management of the object has received a lot of attention. For example, there is a technology to be used for production and management, in which information such as a history of the object is clarified by giving an ID (an individual recognition number) to an individual object. Above all, the development of semiconductor devices that can send and receive data without contact has been advanced. As such semiconductor devices, an RFID (Radio Frequency Identification) (also referred to as an ID tag, an IC tag, and IC chip, an RF (Radio Frequency) tag, a wireless tag, an electronic tag, or a wireless chip) and the like are beginning to be introduced into companies, markets, and the like.

Many semiconductor devices such as RFIDs that have already been put to practical use have an element group (also referred to as an IC (Integrated Circuit) chip) and a conductive film functioning as an antenna. These semiconductor devices can exchange data with reader/writer via antenna by an electromagnetic-wave.

However, in the case where these semiconductor devices (also referred to as RFID) are mounted on commercial products, a possibility of invading a consumer's privacy is pointed out (Non-Patent Document 1, for example). For example, in the case where an RFID is embedded in a commercial product, there is a possibility that the location of the consumer having the commercial product after purchase is traced. In addition, in the case where an RFID is embedded in a luxury item such as a brand-name product, there is a possibility that information of the RFID is looked at secretly so as to be used for a sort of discrimination of purchasing power. Furthermore, there is a possibility that information of the RFID is rewritten (forged) by a third party. As described above, when an RFID is mounted on a commercial product, the longer the communication range is, the more convenient it is for management and supervision during the distribution process; however, the longer the communication range is, the higher possibility there is that contents of the commercial product is grasped by a third party or the information is forged in the case where the product is purchased by a particular individual.

As a countermeasure for such problems, it can be considered that an RFID is not embedded in a commercial product itself but attached to the price tag or the wrapping paper so as to be removed after purchasing. However, in the case where the tag can be easily removed, there is a fear that the level of security against forgery and theft is lowered. In addition, a measure in which the RFID embedded in a commercial product is destroyed after purchasing so that data is not read externally can be considered. Although this measure is effective when the commercial product is thrown away, information of the commercial product, included in the RFID, cannot be used by the consumer or the producer, and information useful for repair or maintenance of the commercial product will be lost.

[Non-Patent Document] Taiyo Tsuchiya, Privacy of Object, [online], 2004/7, internet (URL: http://www.fri.fujitsu.com/open_knlg/review/rev083/review01.html)

DISCLOSURE OF INVENTION

The object of the present invention is to provide a semiconductor device which can protect privacy of an owner of a commercial product and control the communication range according to use, even when the semiconductor device which can exchange data without contact is mounted on the commercial product.

In order to achieve the above-described object, the invention takes the following measures.

One feature of a semiconductor device of the invention is to include: an element group including a plurality of transistors provided over a substrate; a first conductive film functioning as an antenna provided above the element group; and a second conductive film placed so as to surround the first conductive film, wherein the first conductive film is provided in the shape of a coil; the second conductive film includes a first end portion and a second end portion, and the first end portion and the second end portion are connected via a switching means so that the second conductive film is provided circularly. It is to be noted that "circularly" used in this specification means a condition where the first end portion and the second end portion of the conductive film are connected directly, of course, and also a condition where the first end portion and the second end portion of the conductive film are connected via a substance which is electrically connectable (including a substance which can control on/off of the connection).

Another feature of a semiconductor device of the invention is to include: an element group including a plurality of transistors provided over a substrate; a first conductive film functioning as an antenna provided above the element group; a second conductive film including a first end portion and a second end portion, placed so as to surround the first conductive film; and a third conductive film provided so as to cover the first end portion and the second end portion, with an insulating film therebetween, wherein the first conductive film is provided in the shape of a coil and each end portion thereof is connected to the element group; and the second conductive film includes the first end portion and the second end portion which are placed so as to be insulated from each other.

Another feature of a semiconductor device of the invention is to include: an element group including a plurality of transistors provided over a substrate; a first conductive trim functioning as an antenna, provided above the element group; a second conductive film including a first end portion and a second end portion, placed so as to surround the first conductive film; and a third conductive film provided so as to cover the first end portion and the second end portion, with an insulating film therebetween, wherein the first conductive film is provided in the shape of a coil and each end portion thereof is connected to the element group; and the third conductive film is electrically connected to either one of the first end portion and the second end portion, and the end portion not electrically connected to the third conductive film is insulated.

Another feature of a semiconductor device of the invention is to include: an element group including a plurality of transistors provided over a substrate; a first conductive film functioning as an antenna provided above the element group; and a second conductive film placed so as to surround the first conductive film, wherein the first conductive film is provided in the shape of a coil and each end portion thereof is connected to the element group; and the second conductive film is provided circularly.

Another feature of a semiconductor device of the invention is to include: an element group including a plurality of transistors provided over a substrate; a first conductive film functioning as an antenna provided above the element group; and a second conductive film placed so as to surround the first conductive film, wherein the first conductive film is provided in the shape of a coil; and the second conductive film includes a first end portion and a second end portion, and is provided circularly, with the first end portion and the second end portion connected via a switching means.

Another feature of a semiconductor device of the invention is to include: an element group including a plurality of transistors provided over a substrate; a first conductive film functioning as an antenna provided above the element group; and a second conductive film placed so as to surround the first conductive film, wherein the first conductive film is provided in the shape of a coil; and the second conductive film includes a first end portion and a second end portion, and is provided circularly, with the first end portion and the second end portion connected via any one of the plurality of transistors.

Another feature of a semiconductor device of the invention is to include: an element group including a plurality of transistors provided over a substrate; a first conductive film functioning as an antenna provided above the element group; and a plurality of second conductive films placed so as to surround the first conductive film, wherein the first conductive film functioning as an antenna is provided in the shape of a coil; and each of the second plurality of conductive films includes a first end portion and a second end portion, and is provided circularly, with the first end portion and the second end portion connected via any one of the plurality of transistors.

In the above-described structures, one feature of a semiconductor device of the invention is to include: a memory portion provided in an element group; and the memory portion including a plurality of bit lines extended in a first direction, a plurality of word lines extended in a second direction perpendicular to the first direction, a memory cell provided with a memory element, and a memory cell array including a plurality of the memory cells, wherein the memory element includes an organic compound layer provided between a conductive layer structuring the bit line and a conductive layer structuring the word line.

A semiconductor device of the invention can control a communication range, so that privacy of a person who purchased a commercial product mounting the semiconductor device can be protected by controlling the communication range of the semiconductor device according to the individual's use.

BRIEF DESCRIPTION OF DRAWINGS

FIGS. 8A to 8C are diagrams each showing an example of a manufacturing method of a semiconductor device of the invention.

FIGS. 9A and 9B are diagrams each showing an example of a manufacturing method of a semiconductor device of the invention.

BEST MODE FOR CARRYING OUT THE INVENTION

Figure 1A:
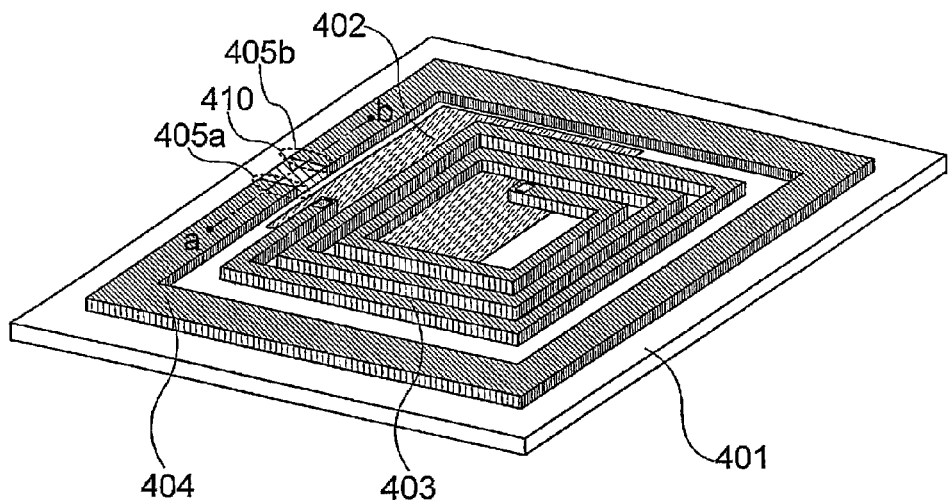
FIGS. 1A to 1C are diagrams each showing an example of a semiconductor device of the invention.

Embodiment modes of the invention will be described hereinafter, with reference to drawings. However, the invention is not limited to the following description, and it is easily understood by those skilled in the art that the modes and details can be changed in various ways without departing from the spirit and scope of the invention. Therefore, the invention is not interpreted limited to the following description of embodiment modes. In the structure of the invention described hereinafter, reference numerals indicating the same things are used in common in different drawings.

[Embodiment Mode 1]

In this embodiment mode, an example of a semiconductor device of the invention will be described with reference to drawings.

Figure 1B:
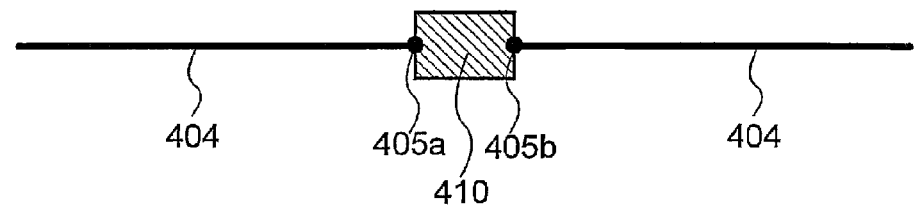
Figure 1C:
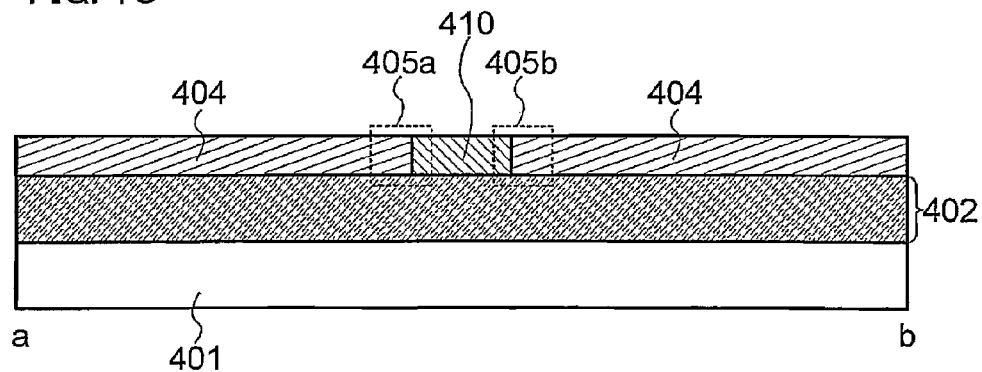

A semiconductor device shown in this embodiment mode includes at least an element group 402 provided over a substrate 401, a conductive film 403 functioning as an antenna provided above the element group 402, and a conductive film 404 to be a dummy pattern placed so as to surround the conductive film 403 (FIG. 1A). The conductive film 403 functioning as an antenna is provided in the shape of a coil, and each end portion of the conductive film 403 is electrically connected to the element group 402. The conductive film 404 includes a first end portion 405a and a second end portion 405b, and each of the first end portion 405a and the second end portion 405b is connected to a switching means 410, so that the conductive film 404 is provided circularly via the switching means 410 (FIGS. 1B and 1C). It is to be noted that "circularly" used in this specification means a condition where the first end portion 405a and the second end portion 405b of the conductive film 404 are connected directly, of course, and also a condition where the first end portion 405a and the second end portion 405b are connected via a substance which is electrically connectable (here, the switching means 410).

As the substrate 401, a glass substrate such as a barium borosilicate glass or an alumino borosilicate glass, a quartz substrate, a ceramic substrate, a metal substrate including stainless steel, or the like can be used. In addition, a semiconductor substrate of Si or the like may be used. Besides these, a substrate formed of a synthetic resin having flexibility such as acrylic or plastic represented by polyethylene terephthalate (PET), a polyethylene naphthalate (PEN), and a polyethersulfone (PES) can be also used. By using a flexible substrate, a bendable semiconductor device can be manufactured. Also, with such substrates, an area and a shape thereof are not restricted so much; therefore, by using a rectangular substrate with at least one meter on a side as the substrate 401, for example, the productivity can be drastically improved. This merit is greatly advantageous as compared to the case of using a round silicon substrate.

The element group 402 includes at least a transistor, and a vast array of integrated circuit such as a CPU, a memory or a microprocessor can be provided by the transistor. Specifically, the transistor included in the element group 402 can be provided by forming a thin film transistor (TFT) over the substrate 401 formed of glass, plastic or the like, or by forming a field effect transistor (FET) using a semiconductor substrate of Si or the like as the substrate 401 and using the semiconductor substrate as a channel region of the transistor. In addition, it is also possible that an SOI substrate is used as the substrate 401 and a transistor is formed over the substrate. It is to be noted that, in the case of using an SOI substrate, a transistor of the element group can be formed by using a method by bonding of an Si wafer or a method called SIMOX in which an insulating layer is formed inside by implanting oxygen ions in an Si substrate.

The conductive films 403 and 404 can be formed by a sputtering method, a CVD method or the like, using a conductive material including one of or a plurality of metals such as copper (Cu), aluminum (Al), silver (Ag), gold (Au), chromium (Cr), molybdenum (Mo), titanium (Ti), tantalum (Ta), tungsten (W) and nickel (Ni), or metal compounds thereof. Furthermore, the conductive film can be formed by a droplet discharging method (also referred to as an ink-jet method) or a printing method such as a screen printing method, using a conductive paste. As the conductive paste, conductor particles of which the size is several nm to several ten μm, dissolved or dispersed in an organic resin can be used. As the conductive particles, metal particles of one or more of silver (Ag), gold (Au), copper (Cu), nickel (Ni), platinum (Pt), palladium (Pd), tantalum (Ta), molybdenum (Mo), titanium (Ti) and the like, fine particles of silver halide, or dispersible nanoparticles can be used. In addition, as the organic resin included in the conductive paste, one or more selected from organic resins functioning as a binder of metal particles, a solvent, a dispersing agent and a coating material can be used. As the representatives, organic resins such as an epoxy resin and a silicon resin can be given. When forming a conductive film, baking is preferably performed after the paste is applied. For example, in the case where fine particles (of which the size is 1 nm or more and 100 nm or less) containing silver as its main component are used as a material for the paste, a conductive film can be obtained by stiffening the paste by baking at a temperature of 150 to 300° C. Furthermore, the conductive films 403 and 404 can be formed simultaneously by using the above-described method, or formed separately.

The switching means 410 is connected to the first end portion 405a and the second end portion 405b of the conductive film 404 to be a dummy pattern, and has a means for switching (switching on/off) the electrical connection between the first end portion 405a and the second end portion 405b. The switching means 410 can be provided with any structure, as long as it has a means for switching the electrical connection between the first end portion 405a and the second end portion 405b of the conductive film 404. In addition, the switching means 410 can be provided with a structure which can switch the electrical connection only once, or with a structure which can switch the electrical connection a plurality of times.

The semiconductor device of this embodiment mode can control the communication range of the semiconductor device by switching the electrical connection between the first end portion 405a and the second end portion 405b of the conductive film 404 by using the switching means 410. Hereinafter, a case of using an electromagnetic coupling type or an electromagnetic induction type with the conductive film 403 provided in the shape of a coil will be described.

Figure 3:
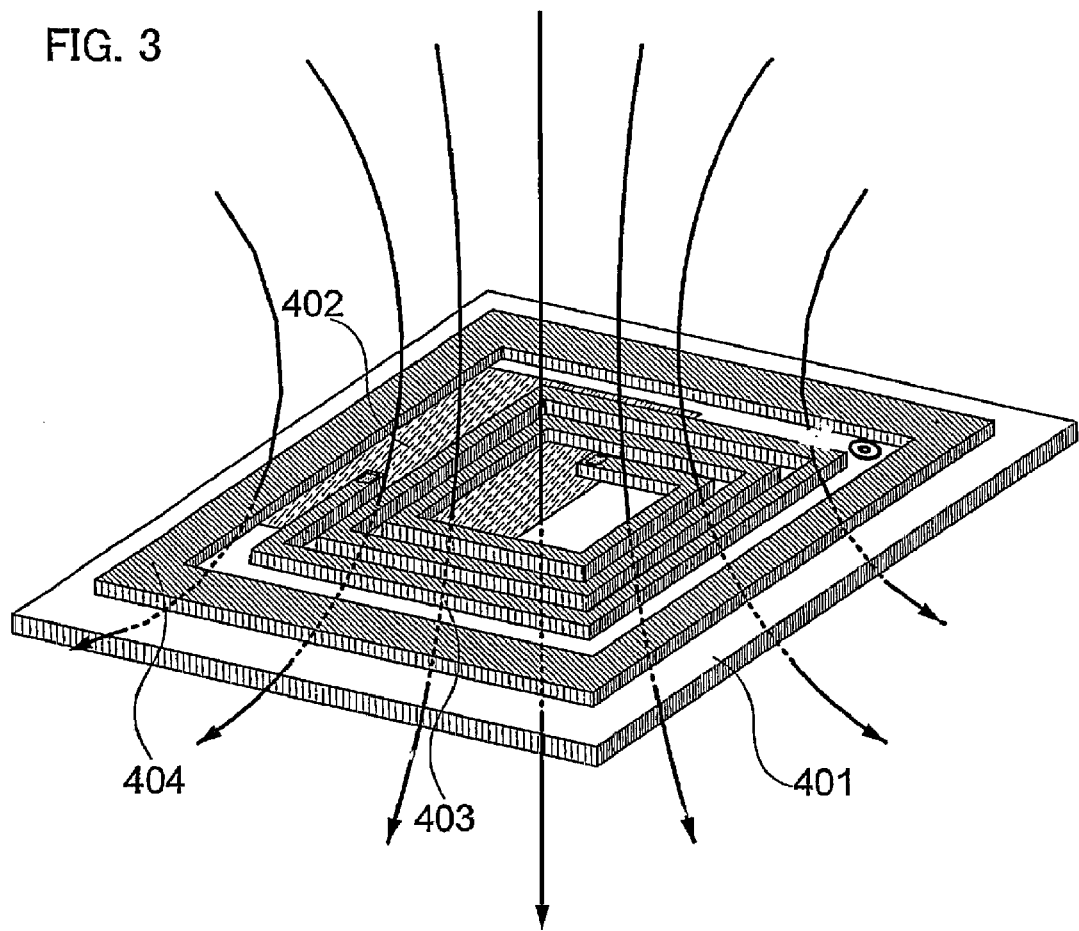
FIG. 3 is a diagram showing an example of a semiconductor device of the invention.

Generally, in the case of using the electromagnetic coupling type or the electromagnetic induction type, a power supply voltage is generated in the element group 402 by using an electromagnetic wave sent from external equipment (reader/writer) so that information is exchanged. Therefore, when a magnetic field is generated (a direction from top to down, in FIG. 3) in a region surrounded by the conductive film 403 provided in the shape of a coil and the conductive film 404 provided circularly (in the case where the first end portion 405a and the second end portion 405b of the conductive film 404 are connected directly, or the case where the first end portion 405a and the second end portion 405b are electrically connected via the switching means (when the switching means 410 is on)), a current is generated in the conductive films 403 and 404 so as to cancel the generated magnetic field.

For example, when an electromagnetic wave is sent from a reader/writer to a semiconductor device, the semiconductor device supplies a power supply voltage and a signal to the element group 402 via the conductive film 403 functioning as an antenna. On the other hand, an electromagnetic wave is also sent to the conductive film 404 to be a dummy pattern, and a current keeps flowing in the conductive film 404 while the magnetic field is changed. By this current generated in the conductive film 404, a magnetic field (a direction from bottom to top) is generated so as to cancel the electromagnetic wave sent from the reader/writer. In addition, also when an electromagnetic wave is sent from the semiconductor device to the reader/writer, a magnetic field is generated so as to cancel the electromagnetic wave, due to the existence of the conductive film 404.

As a result, a magnetic field sent from the reader/writer or sent from the semiconductor device is canceled by a magnetic field generated by a current generated in the conductive film 404, and the communication range is lowered. On the contrary, in the case where the first end portion 405a and the second end portion 405b of the conductive film 404 do not make a circle, or the case where the first end portion 405a and the second end portion 405b do make a circle via the switching means 410 but they are not electrically connected (the switching means 410 is in an off state), a current does not keep flowing in the conductive film 404 by a change in a magnetic field, therefore, the communication range is not lowered.

In this manner, the communication range of the semiconductor device can be controlled by on/off of the switching means 410. As described above, the switching means can be provided with any structure as long as it has a means for switching the electrical connection between the first end portion 405a and the second end portion 405b of the conductive film 404, and for example, a transistor, a mechanical switch, a membrane switch, a conductive rubber switch, an electrostatic capacity switch or the like can be used.

A case where a transistor is used as the switching means 410 will be described with reference to drawings hereinafter. As the transistor, a thin film transistor (TFT) formed over a substrate made of glass, plastic or the like, a field effect transistor (FET) using a semiconductor substrate of Si or the like and using the semiconductor substrate as a channel region of the transistor, or the like can be used. Here, a case of using a rim film transistor will be described.

Figure 2A:
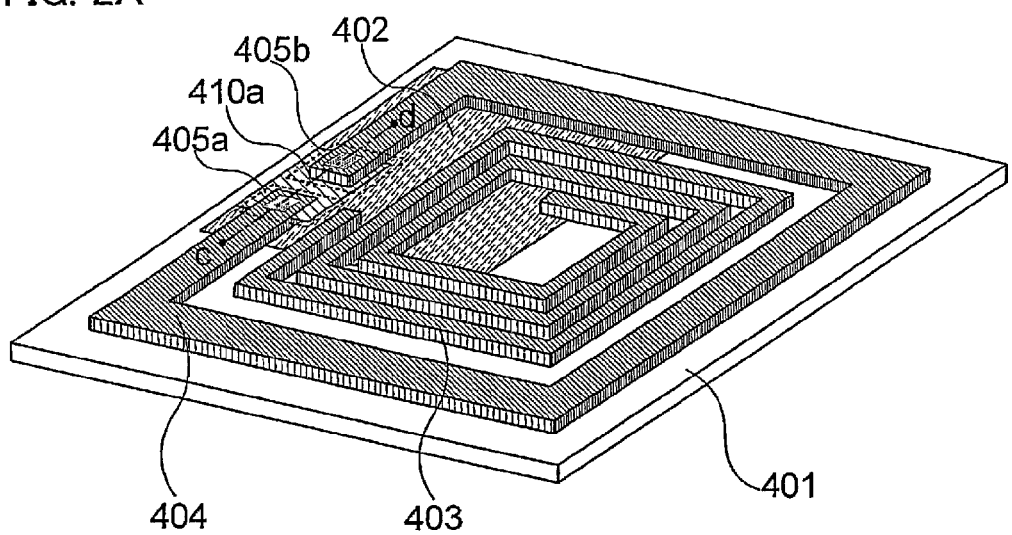
FIGS. 2A to 2C are diagrams each showing an example of a semiconductor device of the invention.
Figure 2B:
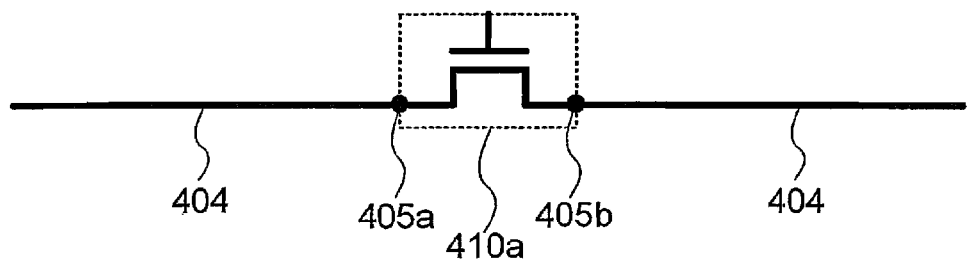
Figure 2C:
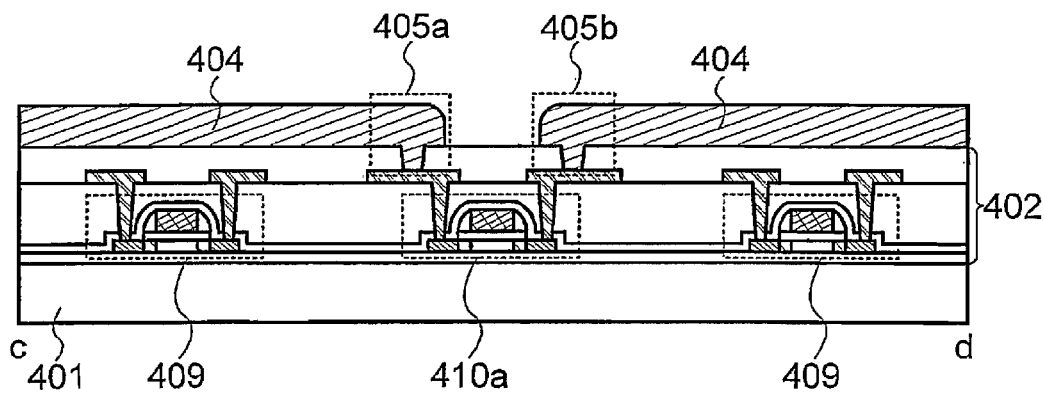

In the case of using a transistor 410a as the switching means (FIG. 2A), either one of the first end portion 405a and the second end portion 405b of the conductive film 404 can be provided so as to be electrically connected to a source region of the transistor 410a, and the other one can be provided so as to be electrically connected to a drain region of the transistor 410a (FIG. 2B). The transistor 410a can be provided in the same layer as the element group 402 (FIG. 2C). In this case, a transistor 409 included in the element group 402 and the transistor 410a functioning as a switching means can be formed simultaneously.

When a voltage is applied to a gate electrode of the transistor 410a (when the transistor 410a is on), a current flows in the conductive film 404 connected via the source region and the drain region of the transistor 410a. Therefore, when an electromagnetic wave is sent from the reader/writer, a current flows so as to cancel the change in the magnetic field accompanying it, and the communication range can be lowered.

The controlling of on/off of the transistor becomes possible by using a nonvolatile memory in a memory portion. As for a means to keep applying a voltage to the gate electrode of the transistor, it becomes possible by connecting a capacitative element or a ferroelectric material (for example, a perovskites compound such as PZT (lead zirconate titanate), a layered perovskites compound such as SBZ (barium titanate strontium) or the like) to the gate electrode of the transistor. In addition, by connecting a power source (battery) to the gate electrode of the transistor, it is possible to keep applying a voltage to the transistor.

Besides the above-described methods, another structure in which the first end portion 405a and the second end portion 405b of the conductive film 404 are connected can be used as a switching means. The specific example will be described with reference to FIGS. 5A to 5D hereinafter.

Figure 5A:
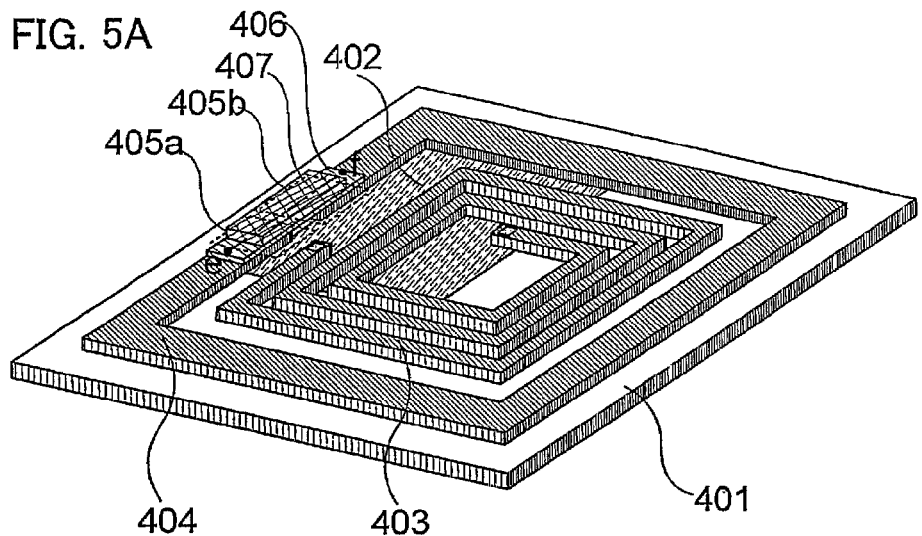
FIGS. 5A to 5D are diagrams each showing an example of a semiconductor device of the invention.
Figure 5B:
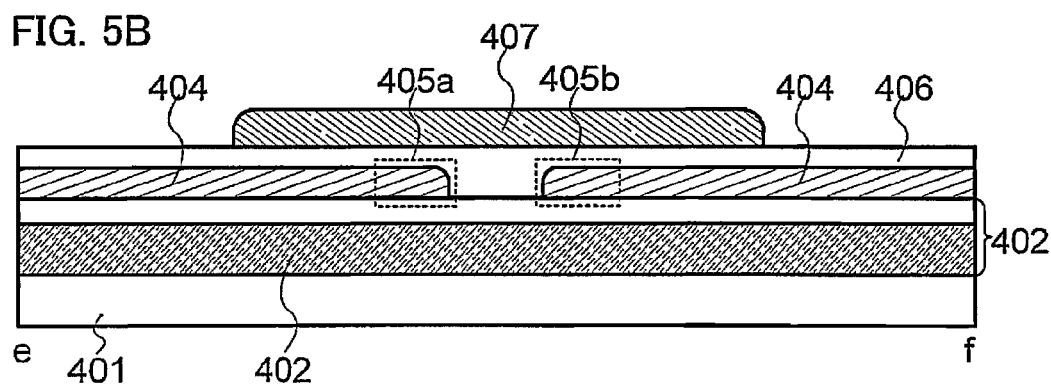

A semiconductor device shown in FIGS. 5A to 5D includes at least an element group 402 provided over a substrate 401, a conductive film 403 functioning as an antenna provided above the element group 402, and a conductive film 404 including a first end portion 405a and a second end portion 405b, placed so as to surround the conductive film 403, and a conductive film 407 is provided above the conductive film 404 with an insulating film 406 therebetween (FIGS. 5A and 5B). It is to be noted that the insulating film 406 may be formed over the entire surface, or formed selectively over a part covering the first end portion 405a and the second end portion 405b of the conductive film 404.

The insulating film 406 can be formed of an insulating film including oxygen or nitrogen, such as silicon oxide (SiOx), silicon nitride (SiNx), silicon oxynitride (SiOxNy) (x>y) or silicon nitride oxide (SiNxOy) (x>y), a film containing carbon, such as DLC (diamond like carbon), or the like, by using a CVD method, a sputtering method, or the like. In addition to that, it can be formed as a single layer or a laminated structure of an organic material such as epoxy, polyimide, polyamide, polyvinyl phenol, benzocyclobutene, or acryl, a siloxane series material or the like, by a droplet discharging method, a screen printing method, a spin coating method or the like.

The conductive film 407 can be formed by a sputtering method, a CVD method or the like, using a conductive material including one of or a plurality of metals such as copper (Cu), aluminum (Al), silver (Ag), gold (Au), chromium (Cr), molybdenum (Mo), titanium (Ti), tantalum (Ta), tungsten (W) and nickel (Ni), or metal compounds thereof. Furthermore, the conductive film can be formed by a droplet discharging method or a printing method such as a screen printing method, using a conductive paste. As the conductive paste, conductive particles of which the size is several nm to several dozen μm, dissolved or dispersed in an organic resin can be used. As the conductive particles, metal particles of one or more of silver (Ag), gold (Au), copper (Cu), nickel (Ni), platinum (Pt), palladium (Pd), tantalum (Ta), molybdenum (Mo), titanium (Ti) and the like, fine particles of silver halide, or dispersible nanoparticles can be used. In addition, as the organic resin included in the conductive paste, one or more selected from organic resins functioning as a binder of metal particles, a solvent, a dispersing agent and a coating material can be used. As the representatives, organic resins such as an epoxy resin and a silicon resin can be given. When forming a conductive film, baking is preferably performed after the paste is pushed out. For example, in the case where fine particles (of which the size is 1 nm or more and 100 nm or less) containing silver as its main component are used as a material for the paste, a conductive film can be obtained by stiffening the paste by baking at a temperature of 150 to 300° C.

In the semiconductor device shown in FIG. 5B, two end portions of the conductive film 404 (the first end portion 405a and the second end portion 405b) are not connected. That is, the conductive film 404 is not provided circularly, so that even when an electromagnetic wave is sent from a reader/writer, a current does not flow in the conductive film 404 and the communication range of the semiconductor device is not lowered.

Figure 5C:
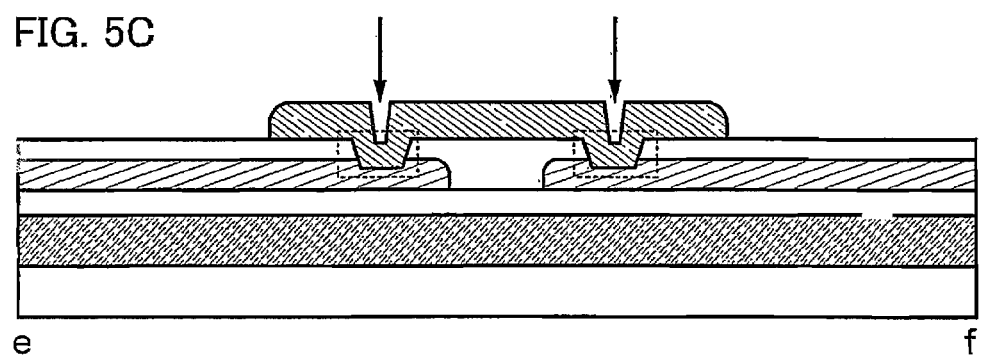
Figure 5D:
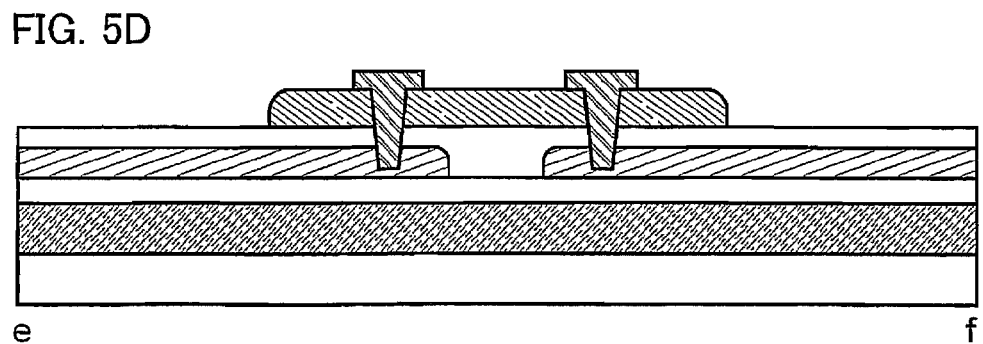

On the other hand, by connecting each of the first end portion 405a and the second end portion 405b of the conductive film 404 to the conductive film 407 electrically, the first end portion 405a and the second end portion 405b are connected via the conductive film 407, and as a result, the conductive film 404 can be regarded as provided circularly (FIGS. 5C and 5D). In this case, when an electromagnetic wave is sent from a reader/writer (when a change in a magnetic field occurs), by a current generated in the conductive film 404 as described above, the electromagnetic wave is weakened, and the communication range of the semiconductor device is shortened. Since the attenuation of the communication range depends on a shape or a cross-sectional area of the conductive film 404, the communication range can be controlled by a practitioner selecting the shape and the cross-sectional area of the conductive film 404 arbitrarily. For example, it is possible to make the communication range zero (a condition in which data of the semiconductor device cannot be read unless contacting).

As a method for connecting each of the first end portion 405a and the second end portion 405b to the conductive film 407, laser light irradiation, a method in which a conductive needle or the like is pushed in physically, or the like can be used. Specifically, in the case of using laser light irradiation, a part of the conductive film 407 corresponding to the first end portion 405a and a part of the conductive film 407 corresponding to the second end portion 405b are selectively irradiated with laser light so that the conductive film 407 and the insulating film 406 are melted together in those parts, and each of the first end portion 405a and the second end portion 405b can be electrically connected to the conductive film 407 (FIG. 5C). On the other hand, in the case of using a method in which a conductive needle is pushed in physically, conductive needles or the like are pushed into a part of the conductive film 407 corresponding to the first end portion 405a and a part of the conductive film 407 corresponding to the second end portion 405b selectively, so as to penetrate the insulating film 406 and a part of the conductive film 404, so that each of the first end portion 405a and the second end portion 405b can be electrically connected to the conductive film 407 (FIG. 5D).

Alternatively, either one of the first end portion 405a and the second end portion 405b of the conductive film 404 may be electrically connected to the conductive film 407 beforehand. Even in the case where only one of the first end portion 405a and the second end portion 405b of the conductive film 404 is electrically connected to the conductive film 407, the conductive film 404 is not provided circularly, so that there is no effect on the communication range of the semiconductor device. In this case, the communication range can be lowered just by connecting one of the first end portion 405a and the second end portion 405b of the conductive film 404, which is not electrically connected to the conductive film 407, to the conductive film 407.

The semiconductor device shown in FIGS. 5A to 5D can change the communication range from a long condition to a short condition, only once. This is effective when preventing information of the semiconductor device from being looked at secretly by a third party externally. For example, in the case where the semiconductor device is mounted on a commercial product, the communication range needs to be long for management, supervision and the like of the product until the product reaches a consumer; however, when the product reaches the consumer, me communication range may be shortened so that information of the product is displayed only at the will of the consumer. Therefore, by shortening the communication range of the semiconductor device by electrically connecting the first end portion 405a and the second end portion 405b of the conductive film 404 to each other, as shown in FIGS. 5C and SD, when the consumer purchases the product, information of the product is prevented from being stolen from the outside, and invasion of privacy can be also prevented. Especially, by making the communication range zero (a condition in which data of the semiconductor device cannot be read unless contacting), information can be limitlessly prevented from being looked at secretly by a third party.

Figure 4A:
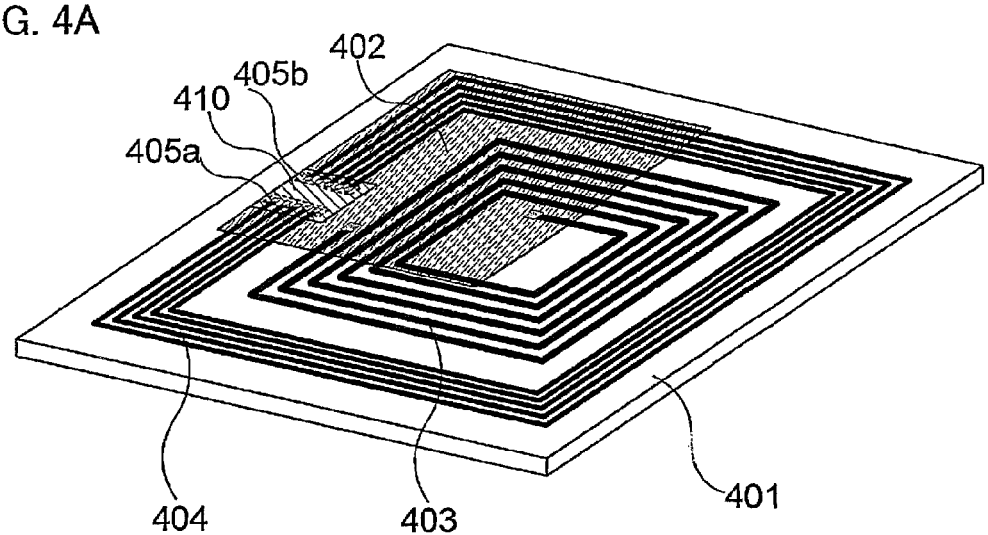
FIGS. 4A and 4B are diagrams each showing an example of a semiconductor device of the invention.
Figure 4B:
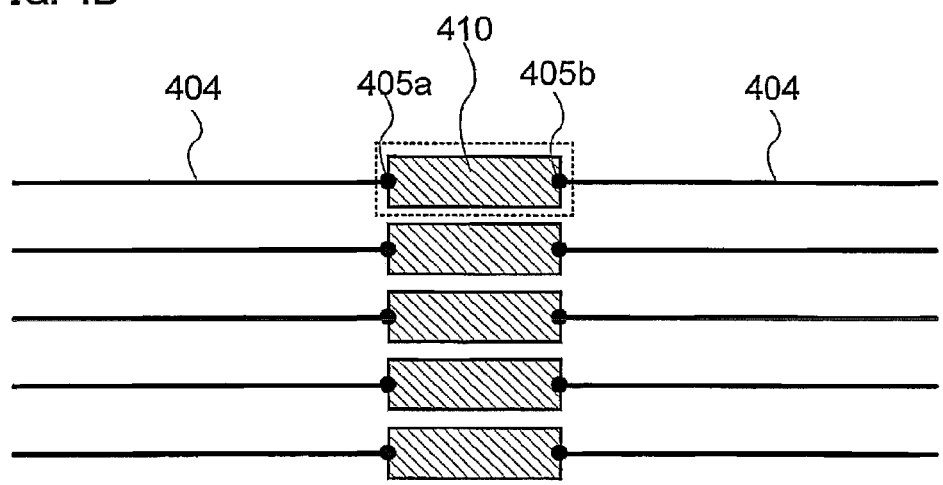

Furthermore, in the above-described structure, the number of conductive films 404 and the number of switching means 410 may be more than one (FIGS. 4A and 4B). Specifically, a plurality of conductive films 404 are provided, surrounding the conductive film 403, so that each end portion of the conductive films 404 is connected to the switching means 410. As the switching means 410, any of the above-described means can be used. For example, a transistor 410a is provided for each end portion of the plurality of conductive films 404, and by controlling the plurality of transistors 410a, the communication range of the semiconductor device can be controlled step by step. Furthermore, in the case of using a method shown in FIGS. 4A and 4B, the communication range can be controlled step by step, not only once but a plurality of times, so that the communication range can be changed according to a usage pattern of the consumer.

[Embodiment Mode 2]

In this embodiment mode, a semiconductor device which is different from one in the above-described embodiment mode will be described, with reference to drawings. Specifically, a method for controlling the communication range of a semiconductor device by using a physical means as a switching means will be described.

Figure 6A:
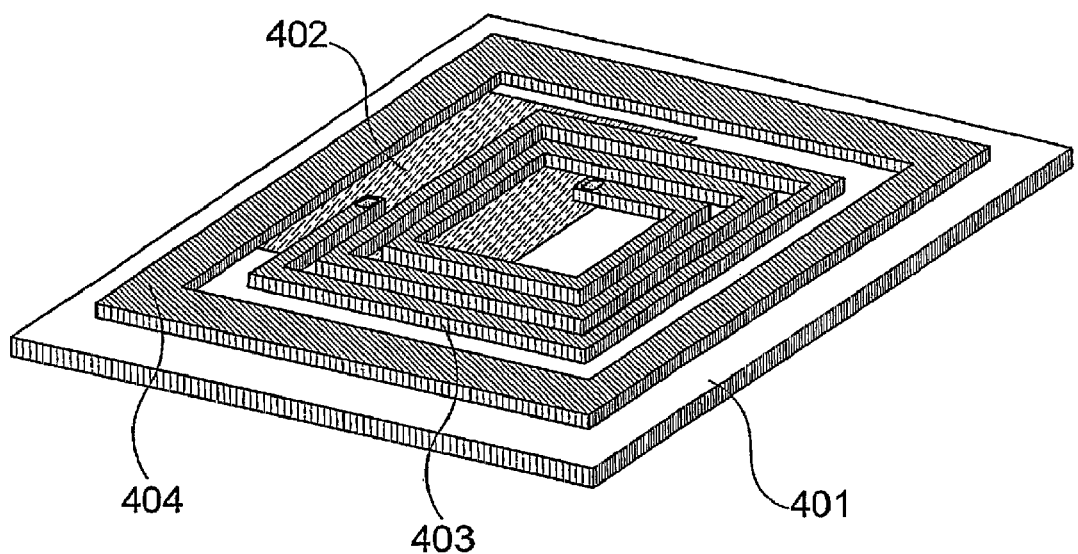
FIGS. 6A and 6B are diagrams each showing an example of a semiconductor device of the invention.

A semiconductor device shown in this embodiment mode includes at least an element group 402 provided over a substrate 401, a conductive film 403 functioning as an antenna, provided above the element group 402, and a conductive film 404 to be a dummy pattern placed so as to surround the conductive film 403 (FIG. 6A). The conductive film 403 functioning as an antenna is provided in the shape of a coil, and each end portion of the conductive film 403 is electrically connected to the element group 402. The conductive film 404 is provided circularly (a condition in which the above-described first end portion 405a and the second end portion 405b are connected directly).

Figure 6B:
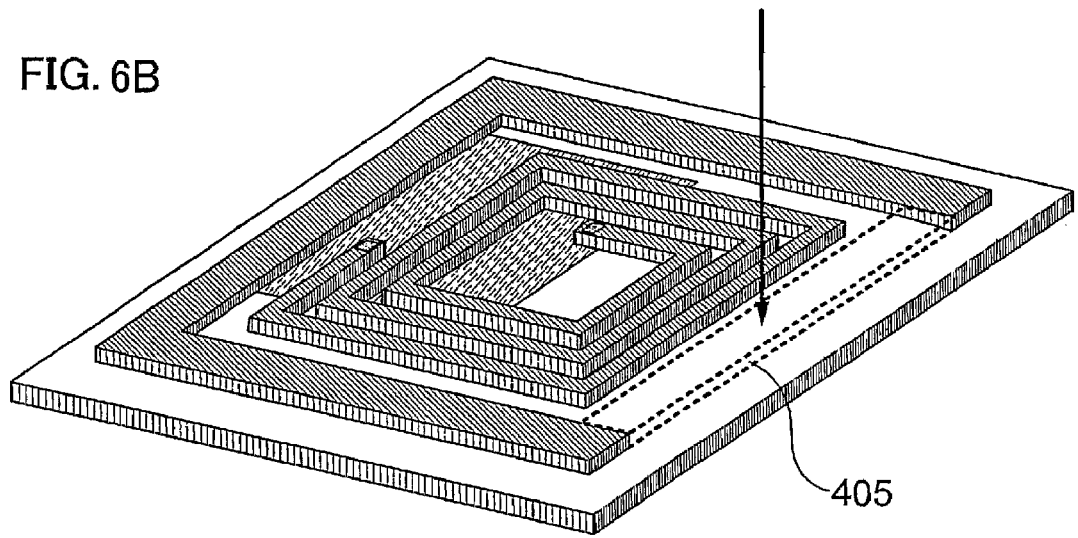

In the semiconductor device shown in FIG. 6A, when an electromagnetic wave is sent from a reader/writer, the communication range is shortened due to the existence of the conductive film 404 provided circularly as described above. However, in the case where a part of the conductive film 404 is removed so as to make the conductive film 404 non-circular, the communication range of the semiconductor device can be long, as described above (FIG. 6B). As a means for removing the conductive film 404, selective laser light irradiation can be performed. In addition to the laser light, a method in which the conductive film 404 is cut physically can be used. The semiconductor device of this embodiment mode can change the communication range from a short condition to a long condition only once. This, for example, can be used when the semiconductor device is attached to a substance which cannot be thrown away easily, such as a dangerous material or an industrial waste, and the substance is to be managed or supervised.

This embodiment mode can be implemented freely combining with the above-described Embodiment Mode 1.

[Embodiment Mode 3]

In this embodiment mode, a semiconductor device which is different from one in the above-described embodiment mode will be described with reference to drawings. Specifically, a method in which connection between a conductive film functioning as an antenna and an element group is performed via a switching means will be described.

Figure 7A:
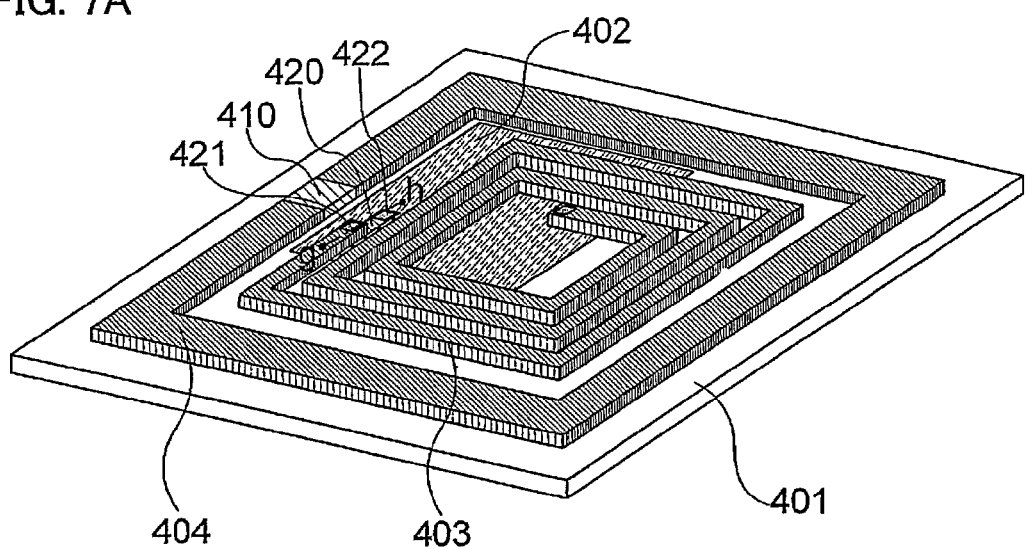
FIGS. 7A and 7B are diagrams each showing an example of a semiconductor device of the invention.
Figure 7B:
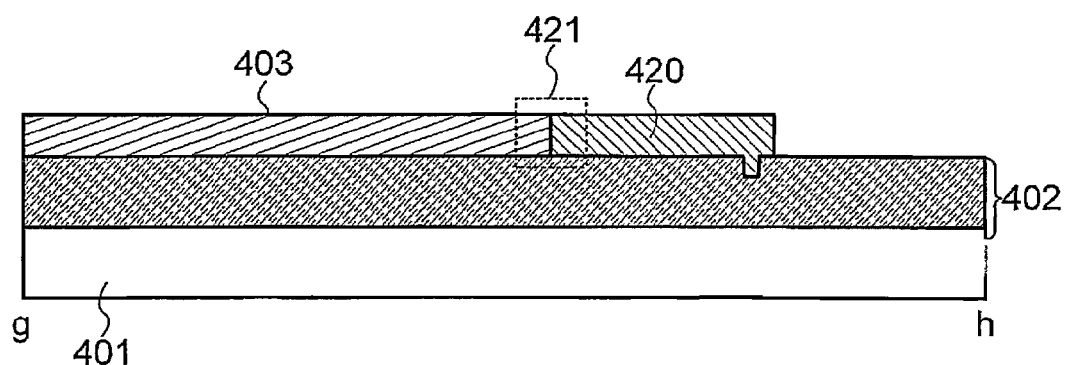

A semiconductor device shown in this embodiment mode includes at least an element group 402 provided over a substrate 401, a conductive film 403 functioning as an antenna provided above the element group 402, and a conductive film 404 to be a dummy pattern placed so as to surround the conductive film 403 (FIGS. 7A and 7B). In addition, the conductive film 403 functioning as an antenna is provided in the shape of a coil, and one end portion 421 of the conductive film 403 is connected to the element group 402 via a switching means 420.

As a switching means 420, any of the switching means shown in the above-described Embodiment Mode 1 can be used. For example, in the case of using a transistor as the switching means 420, the semiconductor device can communicate with a reader/writer when the transistor is turned on, and the semiconductor device cannot communicate with the reader/writer when the transistor is turned off. This is effective when information of the semiconductor device mounted on a commercial product becomes unnecessary. On the other hand, as shown in the above-described FIGS. 5A to 5D, a structure in which the one end portion 421 of the conductive film 403 is connected to the element group 402 by using a physical means. In this case, information of the semiconductor device cannot be read without contact before the one end portion 421 of the conductive film 403 is connected to the element group 402, but information of the semiconductor device can be read without contact after they are connected.

Furthermore, in the case where the switching means 420 connecting the one end portion 421 of the conductive film 403 to the element group 402 as a switching means is removed, as shown in the above-described Embodiment Mode 2, communication between the semiconductor device and the outside becomes impossible. This is effective when information of the semiconductor device mounted on a commercial product becomes unnecessary, when information of the semiconductor device becomes unnecessary in the case shown in the above-described Embodiment Mode 2, or the like.

This embodiment mode can be implemented freely combining with the above-described Embodiment Modes 1 and 2.

[Embodiment Mode 4]

In this embodiment mode, an example of a manufacturing method of a semiconductor device of the invention, which includes a thin film transistor and an antenna, will be described with reference to drawings.

First, a peeling layer 702 is formed over the a surface of a substrate 701, and an amorphous semiconductor film 704 (a film containing amorphous silicon, for example) is formed over the peeling layer 702, with an insulating film 703 therebetween (FIG. 8A)

As the substrate 701, a glass substrate, a quartz substrate, a metal substrate, a stainless steel substrate, a plastic substrate having heat resistance against the treatment temperature of this step, or the like may be used. With such substrates, an area and a shape thereof are not particularly restricted; therefore, by using a rectangular substrate with at least one meter on a side as the substrate 701, for example, the productivity can be drastically improved. Such merit is greatly advantageous as compared to the case of using a round silicon substrate. It is to be noted that, the peeling layer 702 is formed over an entire surface of the substrate 701 in this step; however, the peeling layer 702 may be selectively provided as needed by etching using a photolithography method after the peeling layer is formed over the entire surface of the substrate 701. In addition, the peeling layer 702 is formed to be in contact with the substrate 701; however, an insulating film may be formed as a base film to be in contact with the substrate 701 as needed and the peeling layer 702 may be formed to be in contact with the insulating film.

As the peeling layer 702, a metal film, a laminated structure of a metal film and a metal oxide film, or the like may be used. The metal film is formed as a single layer or a laminated layer of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the above-described element as its main component. The film can be formed by a sputtering method, various CVD methods such as a plasma CVD method or the like, using these materials. As the laminated structure of a metal film and a metal oxide film, after the above-described metal film is formed, an oxide of the metal film can be formed on the metal film surface by performing a plasma treatment in an oxygen atmosphere or a heat treatment in an oxygen atmosphere. For example, in the case where a tungsten film formed by a sputtering method is provided as a metal film, a metal oxide film of tungsten oxide can be formed on the tungsten film surface by performing a plasma treatment on the tungsten film. In this case, an oxide of tungsten is expressed in $WO_x$, and x is 2 to 3. There are cases of x=2 ($WO_2$), x=2.5 ($W_2O_5$), x=2.75 ($W_4O_{11}$), x=3 ($WO_3$), and the like. When forming an oxide of tungsten, the values of x described above are not particularly restricted, and which oxide is to be formed may be decided based on an etching rate or the like. In addition, it is possible to form an oxide film on the metal film surface by performing a plasma treatment in the condition of high density (preferably $1 \times 10^{11}$ cm$^{-3}$ or more and $1 \times 10^{13}$ cm$^{-3}$ or less) using high frequency (a microwave or the like) and a low electron temperature (preferably 0.5 eV or more and 1.5 eV or less), (hereinafter the plasma in this condition is also referred to as "high-density plasma"). Furthermore, besides a metal oxide film, a metal nitride or a metal oxynitride may be used. In this case, a plasma treatment or a heat treatment is performed on the metal film in a nitrogen atmosphere or an atmosphere of nitrogen and oxygen. As for a condition of the Plasma treatment, the above-described one may be used.

As the insulating film 703, a single layer or a laminated layer of a film containing an oxide of silicon or a nitride of silicon is formed by a sputtering method, a plasma CVD method or the like. In the case where the base insulating film employs a two-layer structure, a silicon nitride oxide film may be formed as a first layer, and a silicon oxynitride film may be formed as a second layer, for example. In the case where the base insulating film employs a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as a first insulating film, a second insulating film, and a third insulating film, respectively. The base insulating film functions as a blocking film for preventing the entry of an impurity from the substrate 701.

The amorphous semiconductor film 704 is formed with a thickness of 25 to 200 nm (preferably 30 to 150 nm), by a sputtering method, an LPCVD method, a plasma CVD method or the like.

Next, the amorphous semiconductor film 704 is crystallized by a crystallization method (a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor film. After that, the obtained crystalline semiconductor film is etched so as to have a desired shape, thereby crystalline semiconductor films 706 to 710 are formed (FIG. 8B).

An example of a manufacturing step of the crystalline semiconductor films 706 to 710 will be briefly described hereinafter. First, an amorphous semiconductor film is formed with a thickness of 66 nm by a plasma CVD method. Next, a solution containing nickel that is a metal element for promoting crystallization is retained on the amorphous semiconductor film, and a dehydrogenation treatment (at 500° C., for one hour) and a thermal crystallization treatment (at 550° C., for four hours) are performed on the amorphous semiconductor film, thereby a crystalline semiconductor film is formed. After that, the crystalline semiconductor film is irradiated with laser light as needed, and a photolithography method is used to form the crystalline semiconductor films 706 to 710.

A continuous wave laser beam (a CW laser beam) or a pulsed wave laser beam (a pulsed laser beam) may be used. As a laser beam which can be used here, a laser emitted from one or a plurality of the following can be used: a gas laser such as an Ar laser, a Kr laser or an excimer laser; a laser of which the medium is single crystalline YAG, YVO$_4$, forsterite (Mg$_2$SiO$_4$), YAlO$_3$, GdVO$_4$, or polycrystalline (ceramic) YAG, Y$_2$O$_3$, YVO$_4$, YAlO$_3$, GdVO$_4$, each added with one or more of Nd, Yb, Cr, Ti, Ho, Er, Tm and Ta as a dopant; a glass laser; a ruby laser; an alexandrite laser; a Ti: sapphire laser; a copper vapor laser; or a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd: YVO$_4$ laser (fundamental wave of 1064 nm) can be used. In this case, an energy density of about 0.01 to 100 MW/cm$^2$ (preferably, 0.1 to 10 MW/cm$^2$) is required. The scanning rate is set about 10 to 2000 cm/sec to irradiate the semiconductor film. It is to be noted that, a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti: sapphire laser can be continuously oscillated. Furthermore, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse while the semiconductor film is melted by the laser beam and then is solidified. Therefore, differing from a case of using a pulsed laser with a low oscillation frequency, a solid-liquid interface can be continuously moved in the semiconductor film so that crystal grains, which continuously grow toward a scanning direction, can be obtained.

In addition, when the crystallization of the amorphous semiconductor film is performed by using the metal element for promoting crystallization, it is advantageous in that the crystallization can be performed at a low temperature in a short amount of time, and that the direction of crystals becomes uniform. On the other hand, there is a problem that the property is not stable because the off current is increased due to the remaining metal element in the crystalline semiconductor film. Therefore, it is preferable to form an amorphous semiconductor film functioning as a gettering site over the crystalline semiconductor film. In order to form a gettering site, the amorphous semiconductor film is required to contain an impurity element such as phosphorus or argon, and therefore, it is preferably formed by a sputtering method by which argon can be contained at a high concentration. After that, a heat treatment (an RTA method, thermal annealing using an annealing furnace, or the like) is performed to diffuse the metal element into the amorphous semiconductor film, and the amorphous semiconductor film containing the metal element is removed. In this manner, the contained amount of the metal element in the crystalline semiconductor film can be reduced or removed.

Next, a gate insulating film 705 covering the crystalline semiconductor films 706 to 710 is formed. As the gate insulating film 705, a single layer or a laminated layer of a film containing an oxide of silicon or a nitride of silicon is formed by a plasma CVD method, a sputtering method, or the like. Specifically, a film containing silicon oxide, a film containing silicon oxynitride, or a film containing silicon nitride oxide is formed as a single layer or a laminated layer.

Alternatively, the gate insulating film 705 may be formed by performing the above-described high-density plasma treatment on the crystalline semiconductor films 706 to 710 to oxidize or nitride the surfaces. For example, the film is formed by a plasma treatment introducing a mixed gas of a rare gas such as He, Ar, Kr or Xe and oxygen, nitrogen oxide (NO$_2$), ammonia, nitrogen, hydrogen or the like. When excitation of the plasma in this case is performed by introduction of a microwave, high density plasma with low electron temperature can be generated. By an oxygen radical (there is a case where an OH radical is included) or a nitrogen radical (there is a case where an NH radical is included) generated by this high-density plasma, the surface of the semiconductor film can be oxidized or nitrided.

By a treatment using such high-density plasma, an insulating film with a thickness of 1 to 20 nm, typically 5 to 10 nm, is formed over a semiconductor film. Since the reaction of this case is a solid-phase reaction, an interface state density between the insulating film and the semiconductor film can be extremely low. Since a high-density plasma treatment like this oxidizes (or nitrides) a semiconductor film (crystalline silicon, or polycrystalline silicon) directly, unevenness of a thickness of the insulating film to be formed can be extremely small, ideally. In addition, oxidation is not strengthened even in a grain boundary of crystalline silicon, which makes a very preferable condition. That is, by a solid-phase oxidation of the surface of the semiconductor film by the high-density plasma treatment shown here, an insulating film with good uniformity and low interface state density can be formed without causing oxidation reaction abnormally in a grain boundary.

As the gate insulating film, an insulating film formed by the high-density plasma treatment may be used by itself, or an insulating film of silicon oxide, silicon oxynitride, silicon nitride or the like may be deposited thereover by a CVD method using plasma or thermal reaction, so as to make a laminated layer. In any case, a transistor including an insulating film formed by high-density plasma, in a part of the gate insulating film or in the whole gate insulating film, can reduce unevenness of the property.

Next, a first conductive film and a second conductive film are formed laminated over the gate insulating film 705. The first conductive film is formed with a thickness of 20 to 100 nm by a plasma CVD method, a sputtering method or the like, and the second conductive film is formed with a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb) or the like, or an alloy material or a compound material containing the above-described element as its main component. Alternatively, they are formed of a semiconductor material represented by polycrystalline silicon doped with an impurity element such as phosphorus. As examples of a combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, and the like can be given. Since tungsten and tantalum nitride have high heat resistance, a heat treatment for thermal activation can be performed after the first conductive film and the second conductive film are formed. In addition, in the case of a three-layer structure instead of a two-layer structure, a laminated structure of a molybdenum film, an aluminum film and a molybdenum film is preferably adopted.

Next, a resist mask is formed by a photolithography method, and an etching treatment for forming a gate electrode and a gate line is performed, so that conductive films (also referred to as gate electrodes) 716 to 725 functioning as gate electrodes are formed.

Next, a resist mask is formed by a photolithography method, and an impurity element giving N-type conductivity is added at low concentration to the crystalline semiconductor films 706 and 708 to 710, by an ion doping method or an ion implantation method, so that N-type impurity regions 711 and 713 to 715, and channel-forming regions 780 and 782 to 784 are formed. As the impurity element giving N-type conductivity, an element which belongs to Group 15 may be used; for example, phosphorus (P) and arsenic (As) are used.

Next, a resist mask is formed by a photolithography method, and an impurity element giving P-type conductivity is added to the crystalline semiconductor film 707, so that a P-type impurity region 712 and a channel-forming region 781 are formed. As the impurity element giving P-type conductivity, boron (B) is used, for example.

Next, an insulating film is formed so as to cover the gate insulating film 705 and the conductive films 716 to 725. The insulating film is formed as a single layer or a laminated layer of a film containing an inorganic material such as silicon, an oxide of silicon, or a nitride of silicon, or an organic material such as an organic resin, by a plasma CVD method, a sputtering method, or the like. Next, the insulating film is selectively etched by anisotropic etching mainly in a vertical direction, so that insulating films (also referred to as side walls) 739 to 743 which is in contact with the side surfaces of the conductive films 716 to 725 are formed (FIG. 8C). Furthermore, simultaneously with the manufacture of the insulating films 739 to 743, insulating films 734 to 738 are formed by etching the gate insulating film 705. The insulating films 739 to 743 are used as masks for doping when LDD (Lightly Doped drain) regions are formed later.

Next, using a resist mask formed by a photolithography method and the insulating films 739 to 743 as masks, an impurity element giving N-type conductivity is added to the crystalline semiconductor films 706 and 708 to 710, so that first N-type impurity regions (also referred to as LDD regions) 727, 729, 731 and 733, and second N-type impurity regions 726, 728, 730 and 732 are formed. Concentration of an impurity element contained in the first N-type impurity regions 727, 729, 731 and 733 is lower than concentration of an impurity element contained in the second N-type impurity regions 726, 728, 730 and 732. Through the above-described steps, N-type thin film transistors 744 and 746 to 748 and a P-type thin film transistor 745 are completed.

For forming an LDD region, there is a method using the insulating film that is a side wall as a mask. By using the insulating film that is a side wall as a mask, control of the width of the LDD region is easy, and the LDD region can be formed surely.

Subsequently, an insulating film is formed as a single layer or a laminated layer so as to cover the thin film transistors 744 to 748 (FIG. 9A). The insulating film covering the thin film transistors 744 to 748 is formed as a single layer or a laminated layer using an inorganic material such as an oxide of silicon or a nitride of silicon, an organic material such as polyimide, polyamide, benzocyclobutene, acrylic, epoxy or siloxane, or the like, by an SOG method, a droplet discharging method, or the like. A siloxane-based material is, for example, a substance including a skeleton of a bond of silicon and oxygen and including at least hydrogen as a substituent, or a substance including a skeleton of a bond of silicon and oxygen and at least one of fluoride, an alkyl group, aromatic carbon hydride as a substituent. For example, in the case where the insulating film covering the thin film transistors 744 to 748 has a three-layer structure, a film containing silicon oxide is formed as a first-layer insulating film 749, a film containing a resin is formed as a second-layer insulating film 750, and a film containing silicon nitride is formed as a third-layer insulating film 751.

It is to be noted that before the insulating films 749 to 751 are formed or after one or more of thin films of the insulating films 749 to 751 are formed, a heat treatment for recovering the crystallinity of the semiconductor film, for activating the impurity element which has been added into the semiconductor film, or for hydrogenating the semiconductor film is preferably performed. For the heat treatment, a thermal annealing method, a laser annealing method, an RTA method, or the like is preferably adopted.

Next, the insulating films 749 to 751 are etched by a photolithography method, thereby contact holes are formed to expose the N-type impurity regions 726 and 728 to 732 and the P-type impurity region 785. Subsequently, a conductive film is formed so as to fill the contact holes and patterned to form conductive films 752 to 761 each functioning as a source wiring or a drain wiring.

The conductive films 752 to 761 are formed as a single layer or a laminated layer using an element selected from titanium (Ti), aluminum (Al), and neodymium (Nd), or an alloy material or a compound material containing the above-described element as its main component by a plasma CVD method, a sputtering method, or the like. An alloy material containing aluminum as its main component corresponds to a material containing nickel whose main component is aluminum or an alloy material containing nickel and one or both of carbon and silicon whose main component is aluminum, for example. Each of the conductive films 752 to 761 preferably employs, for example, a laminated layer structure of a barrier film, an aluminum-silicon (Al—Si) film, and a barrier film, or a laminated layer structure of a barrier film, an aluminum-silicon (Al—Si) film, a titanium nitride (TiN) film and a barrier film. It is to be noted that a barrier film corresponds to a thin film formed by using titanium, a nitride of titanium, molybdenum, or a nitride of molybdenum. Aluminum and aluminum-silicon which have low resistance and are inexpensive are optimal materials for forming the conductive films 752 to 761. In addition, generation of a hillock of aluminum or aluminum-silicon can be prevented when upper and lower barrier layers are provided. Furthermore, when the barrier film is formed by using titanium that is a highly-reducible element, even if a thin natural oxide film is formed over the crystalline semiconductor film, the natural oxide film is reduced so that preferable contact with the crystalline semiconductor film can be obtained.

Next, an insulating film 762 is formed so as to cover the conductive films 752 to 761 (FIG. 9B). The insulating film 762 is formed as a single layer or a laminated layer using an inorganic material or an organic material by an SOG method, a droplet discharging method, or the like. The insulating film 762 is preferably formed with a thickness of 0.75 to 3 μm.

Subsequently, the insulating film 762 is etched by a photolithography method, so that a contact hole to expose the conductive film 752 is formed. Then, a conductive film is formed so as to fill the contact hole. The conductive film is formed by a plasma CVD method, a sputtering method, or the like, by using a conductive material. Then, the conductive film is patterned to form a conductive film 765. It is to be noted that the conductive film 765 becomes a connection part with the conductive film functioning as an antenna. Therefore, the conductive film 765 is preferably formed as a single layer or a laminated layer using titanium, or an alloy material or a compound material containing titanium as its main component. In addition, in the photolithography step for forming the conductive film 765, it is preferable to perform wet etching in order to prevent damage to the thin film transistors 744 to 748 in lower layers; hydrogen fluoride (HF) or an ammonia peroxide mixture is preferably used as the etchant.

Figure 10A:
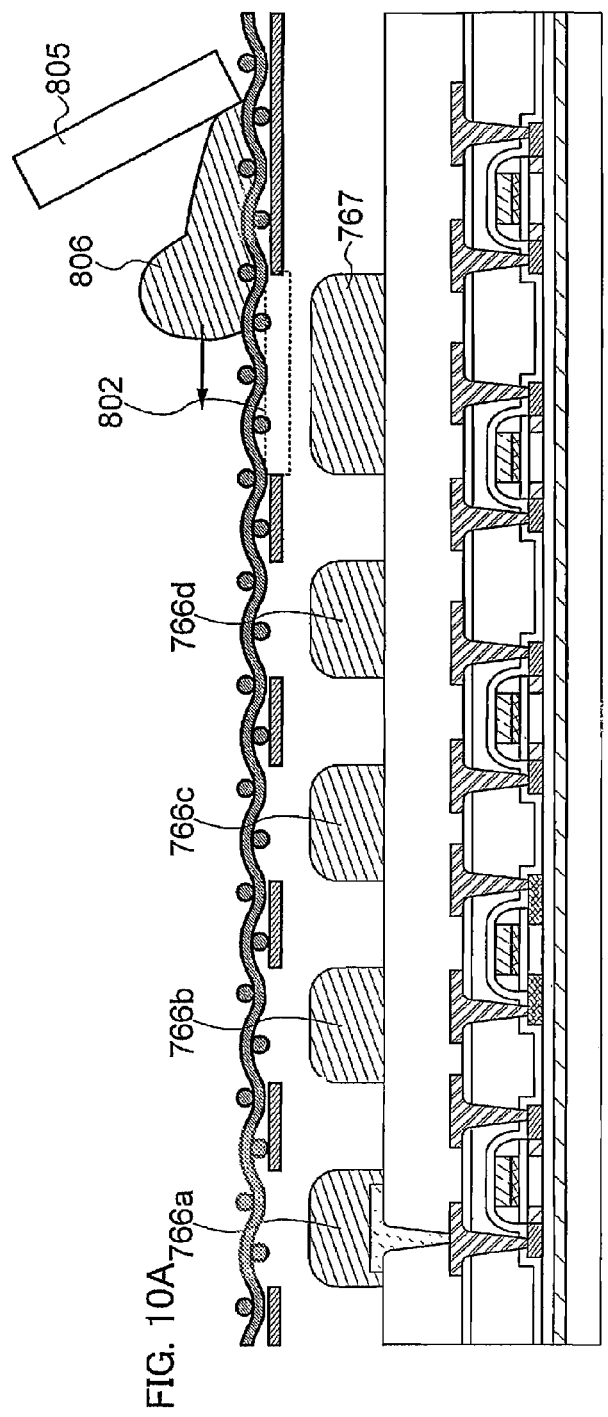
FIGS. 10A and 10B are diagrams each showing an example of a manufacturing method of a semiconductor device of the invention.

Next, a conductive film 766a to 766d functioning as an antenna, in contact with the conductive film 765 and a conductive film 767 functioning as a dummy pattern, are formed (FIG. 10A). The conductive film 766a to 766d and the conductive film 767 are herein formed by using a screen printing method. Here, a paste 806 containing silver (Ag) is pushed out through an opening 802, using a squeegee 805, and then a heat treatment at 50 to 350° C. is performed, so that the conductive film 766a to 766d and the conductive film 767 are formed.

Figure 10B:
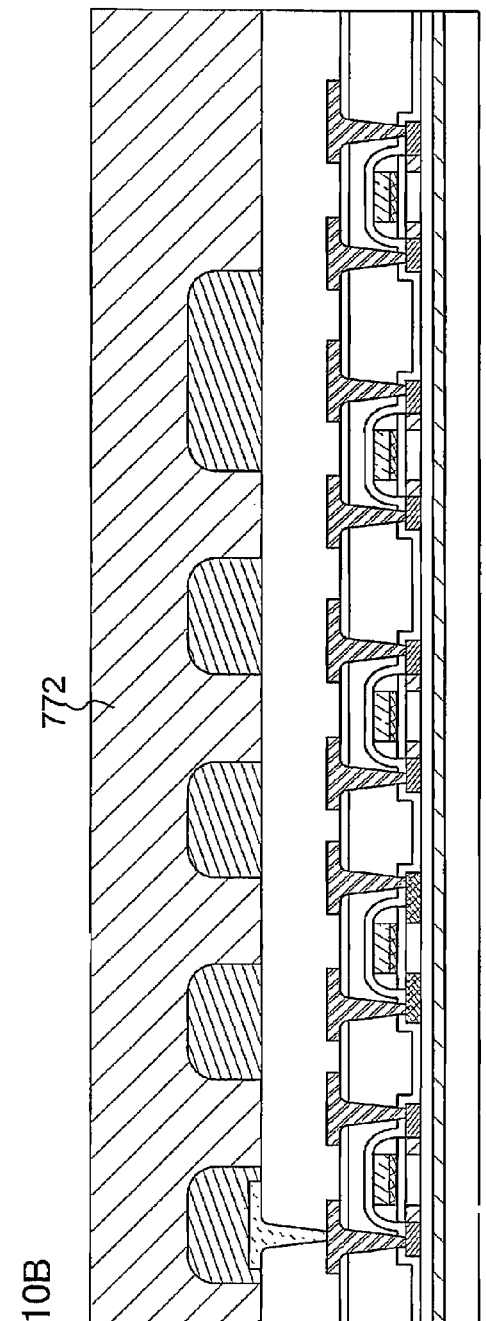

Next, an insulating film 772 functioning as a protective film is formed so as to cover the conductive film 766a to 766d functioning as an antenna and the conductive film 767, by an SOG method, a droplet discharging method or the like (FIG. 10B). The insulating film 772 is formed of a film containing carbon such as DLC (diamond like carbon), a film containing silicon nitride, a film containing silicon nitride oxide, or an organic material, and preferably it is formed of an epoxy resin.

Figure 11A:
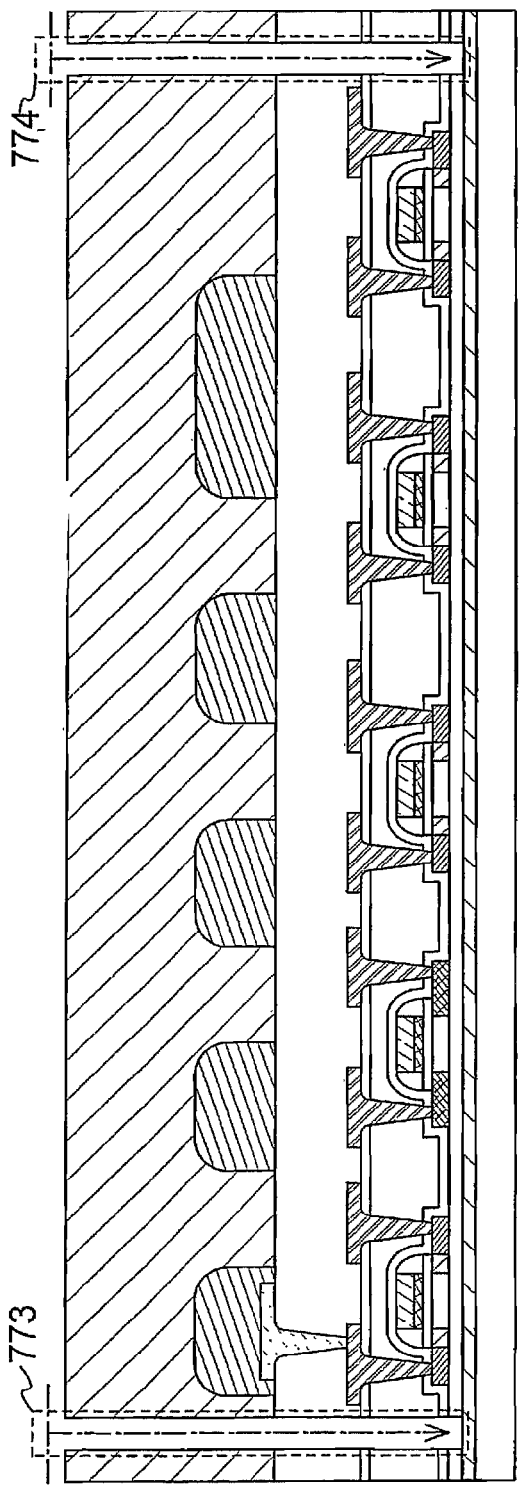
FIGS. 11A and 11B are diagrams each showing an example of a manufacturing method of a semiconductor device of the invention.

Next, the insulating film is etched to form openings 773 and 774 by a photolithography method or laser light irradiation so as to expose a peeling layer 702 (FIG. 11A).

Figure 11B:
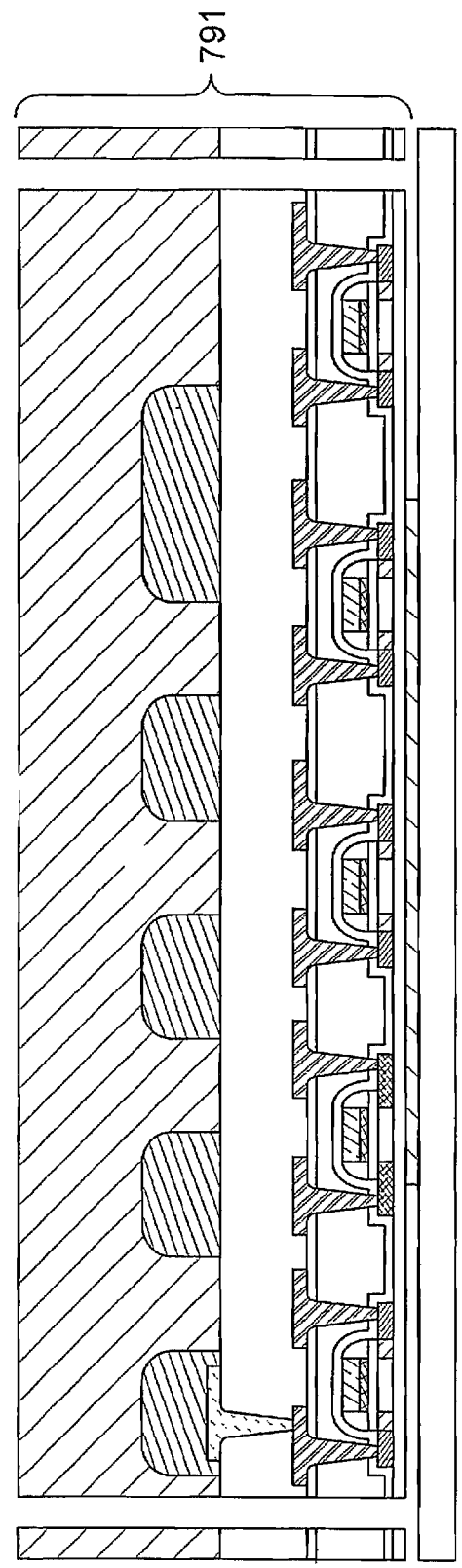

Next, an element forming layer 791 is peeled from the substrate 701. Peeling of the element forming layer 791 is performed by using physical force, after selectively irradiating the element forming layer 791 with laser light to form the openings 773 and 774 (FIG. 11A). Alternatively, as another method, the peeling may be performed after forming the openings 773 and 774 to expose the peeling layer 702 and then introducing an etchant to remove the peeling layer 702 (FIG. 11B). As the etchant, a gas or a liquid containing halogen fluoride or an interhalogen compound is used; for example, chlorine trifluoride ($ClF_3$) is used as a gas containing halogen fluoride. Accordingly, the element forming layer 791 is peeled from the substrate 701. It is to be noted herein that the element forming layer 791 includes an element group including the thin film transistors 744 to 748 and the conductive film 766a to 766d functioning as an antenna. The peeling layer 702 may be partially left instead of being removed entirely. By leaving a part of the peeling layer 702, consumption of the etchant can be reduced and time for removing the peeling layer can be shortened. In addition, the element forming layer 791 can be retained at the substrate 701 even after the peeling layer 702 is removed.

It is preferable to reuse the substrate 701 after the element forming layer 791 is peeled off, in order to reduce the cost. In addition, the insulating film 772 is formed to prevent the element forming layer 791 from scattering after the peeling layer 702 is removed. The element forming layer 791 which is small, thin, and light, easily scatters after the peeling layer 702 is removed, since it is not attached firmly to the substrate 701. However, by forming the insulating film 772 over the element forming layer 791, the element forming layer 791 is weighted and scattering from the substrate 701 can be prevented. In addition, by forming the insulating film 772, the element forming layer 791 which is in itself thin and light is prevented from rolling up by stress or the like after being peeled from the substrate 701, and the strength thereof can be ensured to some degree.

Figure 12A:
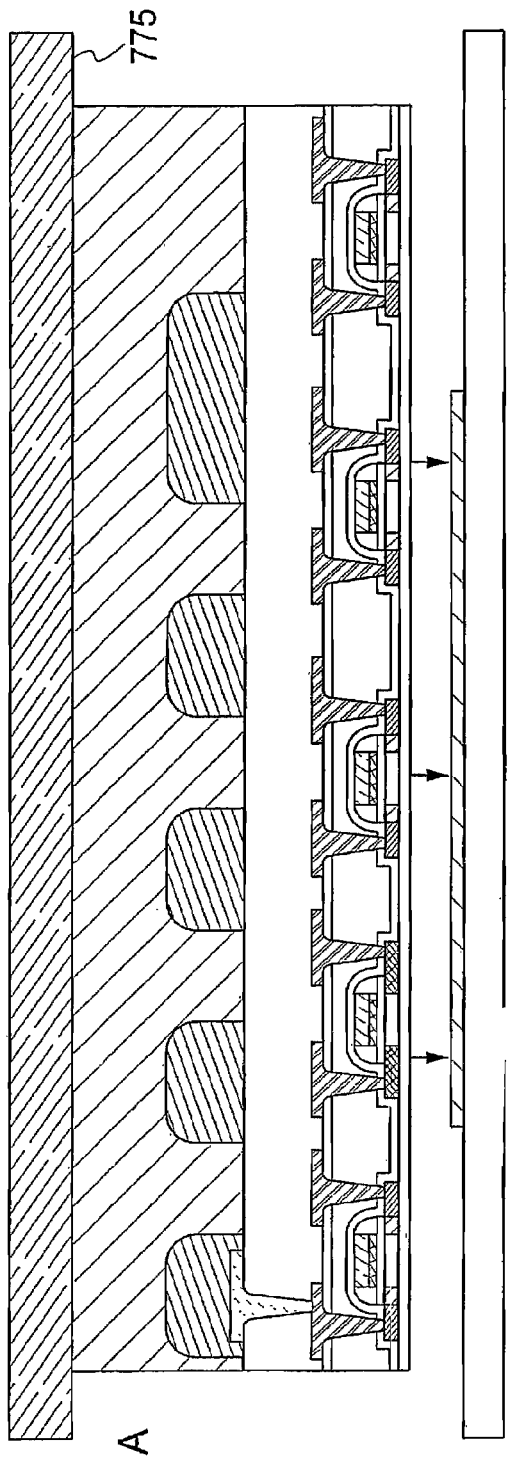
FIGS. 12A and 12B are diagrams each showing an example of a manufacturing method of a semiconductor device of the invention.
Figure 12B:
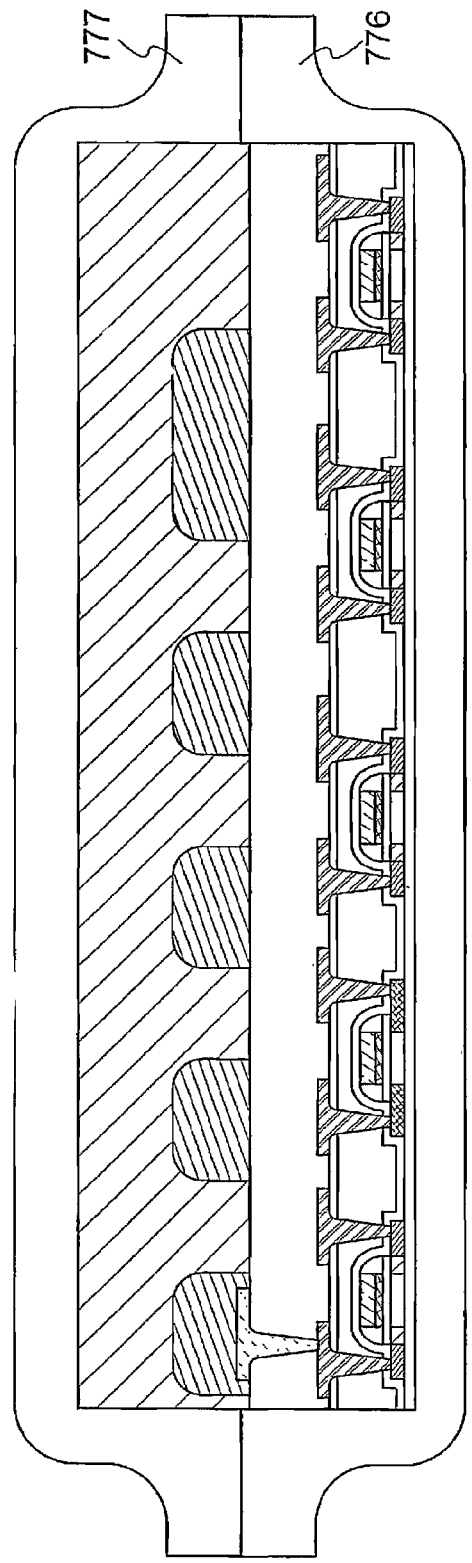

Next, one surface of the element forming layer 791 is attached to a first sheet material 775, and then, the element forming layer 791 is completely peeled from the substrate 701 (FIG. 12A). In the case where the peeling layer 702 is left partially without being removed completely, the element forming layer is peeled from the substrate 701 by a physical means. Then, a second sheet material 776 is provided over the other surface of the element forming layer 791, and one or both of a heat treatment and a pressure treatment are performed to attach the second sheet material 776. Simultaneously with or after providing the second sheet material 776, the first sheet material 775 is peeled and a third sheet material 777 is provided instead. Then, one or both of a heat treatment and a pressure treatment are performed to attach the third sheet material 777. Accordingly, a semiconductor device which is sealed with the second sheet material 776 and the third sheet material 777 is completed (FIG. 12B).

It is to be noted that the sealing may be performed with the first sheet material 775 and the second sheet material 776; however, in the case where a sheet material used for peeling the element forming layer 791 from the substrate 701 is different from a sheet material used for sealing the element forming layer 791, the element forming layer 791 is sealed with the second sheet material 776 and the third sheet material 777 as described above. This is effective in the case where a sheet material having low adhesion is desirable to be used as the sheet material 775, such as the case where the first sheet material 775 may adhere not only to the element forming layer 791 but also to the substrate 701 when the element forming layer 791 is peeled from the substrate 701.

As the second sheet material 776 and the third sheet material 777 used for sealing, a film formed by using polypropylene, polyester, vinyl, polyvinyl fluoride, polyvinyl chloride, or the like, paper of a fibrous material, a laminated film of a base film (polyester, polyamide, an inorganic vapor deposition film, paper, or the like) and an adhesive synthetic resin film (an acrylic-based synthetic resin, an epoxy-based synthetic resin, or the like), or the like can be used. It is to be noted that the above-described film is attached to an object to be treated by performing a heat treatment and a pressure treatment, and the treatments are performed in the following manner: an adhesive layer which is provided on the outermost surface of the film or a layer (not an adhesive layer) which is provided on the outermost layer thereof is melted by the heat treatment, and then pressure is applied, thereby the film is attached. It is to be noted that an adhesive layer may be provided over a surface of the second sheet material 776 or the third sheet material 777, but is not necessarily provided. The adhesive layer corresponds to a layer containing an adhesive such as a heat curable resin, an ultraviolet-curable resin, an epoxy resin-based adhesive or a resin additive. In addition, it is preferable to perform silica coating to the sheet material used for sealing in order to prevent moisture and the like from entering inside after the sealing; for example, a sheet material in which an adhesive layer, a film of polyester or the like, and a silica coat are laminated can be used.

It is to be noted that this embodiment mode can be implemented freely combining with the above-described Embodiment Modes 1 to 3. That is, the materials and the forming methods described in the above-described embodiment modes can also be used in this embodiment mode while the materials and the forming methods described in this embodiment mode can also be used in the above-described embodiment modes.

[Embodiment Mode 5]

In this embodiment mode, a method in which thin film transistors (TFTs) used for a memory element (memory), a logic circuit portion such as, a decoder, a selector, a writing circuit, and a reading circuit are manufactured simultaneously will be described with reference to FIG. 13. It is to be noted that although an n-channel type memory element 3040 having a floating gate is taken as an example of the memory elements; and an n-channel type TFT 3041 and a p-channel type TFT 3042 are taken as an example of the logic circuit, in this embodiment mode, an element group included in a memory portion and a logic circuit portion in the invention is not limited to these. In addition, this manufacturing method is an example, and it is not to limit the manufacturing method over an insulating substrate.

First, base films 3001 and 3002 are formed by using an insulating film such as a silicon oxide film, a silicon nitride film, or a silicon oxynitride film over a glass substrate 3000. For example, a silicon oxynitride film with a thickness of 10 to 200 nm and a hydrogenated silicon oxynitride film with a thickness of 50 to 200 nm are laminated in this order as the base films 3001 and 3002, respectively.

Island-shaped semiconductor layers 3003 to 3005 are formed of a crystalline semiconductor film obtained by performing a laser crystallization method or a thermal crystallization method on an amorphous semiconductor film. The island-shaped semiconductor layers 3003 to 3005 are formed to have a thickness of 25 to 80 nm. A material of the crystalline semiconductor film is not particularly restricted, though silicon or a silicon-germanium (SiGe) alloy may be preferably employed.

At this time, it is possible to carry out a treatment to provide an overlap region for getting out charge, to one of a source region or a drain region of the semiconductor layer 3003 of a TFT used for the memory portion 3040.

Subsequently, a gate insulating film 3006 is formed so as to cover the island-shaped semiconductor layers 3003 to 3005. The gate insulating film 3006 is formed of an insulating film containing silicon with a thickness of 10 to 80 nm by a plasma CVD method or a sputtering method. In the case of an OTP (One-time programmable) nonvolatile memory, in particular, writing by hot electron injection and charge storage are important, therefore a gate insulating film preferably has a thickness of 40 to 80 nm which does not easily allow a tunnel current to flow.

Then, a first conductive layer 3007 to 3009 is formed over the gate insulating film 3006, and removed by etching except a region for a floating gate electrode and a region for a gate electrode of TFTs 3041 and 3042.

Next, a second gate insulating film 3010 is formed with a thickness of 10 to 80 nm by, using an insulating film containing silicon by a plasma CVD method or a sputtering method. The second gate insulating film 3010 is removed by etching except a region of the memory element 3040.

Subsequently, a second conductive layer 3011 to 3013 is formed. The laminated layer in which the first conductive layer 3007, the second gate insulating film 3010, and the second conductive layer 3011 are laminated in this order over the substrate (the memory element 3040); the laminated layer in which the first conductive layer 3008 and the second conductive layer 3012 are laminated in this order over the substrate (the TFT 3041); and the laminated layer in which the first conductive layer 3009 and the second conductive layer 3013 are laminated in this order over the substrate (the TFT 3042) are etched at the same time to form a floating gate electrode and a control gate electrode of the memory element, and a gate electrode of the normal TFT.

In this embodiment, the first conductive layer 3007 to 3009 is formed of TaN with a thickness of 50 to 100 nm, and the second conductive layer 3011 to 3013 is formed of W with a thickness of 100 to 300 nm. However, a material of the conductive layer is not particularly restricted, and any element selected from Ta, W, Ti, Mo, Al, and Cu, an alloy material or a compound material containing such element as its main component may be employed.

Then, N-type doping is carried out to the TFT used for the memory element 3040 to form first impurity regions 3014 and 3015. Next, P-type doping is carried out to the P-channel type TFT 3042 used for the logic circuit portion to form second impurity regions 3016 and 3017. Subsequently, in order to form an LDD region of an N-channel type TFT 3041 used for the logic circuit portion, N-type doping is carried out so that third impurity regions 3018 and 3019 are formed. After that, sidewalls 3020 and 3021 are formed, and N-type doping is carried out to the N-channel type TFT 3041 used for the logic circuit portion so that fourth impurity regions 3022 and 3023 are formed. Such doping can be carried out by an ion doping method or an ion implantation method. Through the above-described steps, the impurity regions are formed in the island-shaped semiconductor layers respectively.

Next, the impurity elements added in each of the island-shaped semiconductor layers are activated. This step is carried out by a thermal annealing method using an annealing furnace. Alternatively, a laser annealing method or a rapid thermal annealing method (RTA method) may be adopted. Then, a heat treatment is carried out at 300 to 450° C. for 1 to 12 hours. in an atmosphere containing 3 to 100% of hydrogen to hydrogenate the island-shaped semiconductor layers. As other means for the hydrogenation, plasma hydrogenation (which uses hydrogen excited by plasma) may be carried out as well.

Next, a first interlayer insulating film 3024 is formed of a silicon oxynitride film with a thickness of 10 to 80 nm nearly equal to the gate insulating film. Then, a second interlayer insulating film 3025 formed of an organic insulating material such as acrylic is formed thereover. Alternatively, an inorganic material may be used instead of an organic insulating material for the second interlayer insulating film 3025. Inorganic $SiO_2$, $SiO_2$ produced by a plasma CVD method (PCVD-$SiO_2$), SOG (Spin on Glass; a coated silicon oxide film), or the like is used as the inorganic material. Etching is carried out in order to form a contact hole after forming the two interlayer insulating films.

Then, electrodes 3026 and 3027 for making contact with a source region and a drain region of the island-shaped semiconductor layer at the memory portion are formed. Similarly, electrodes 3028 to 3030 are formed at the logic circuit portion.

Figure 13:
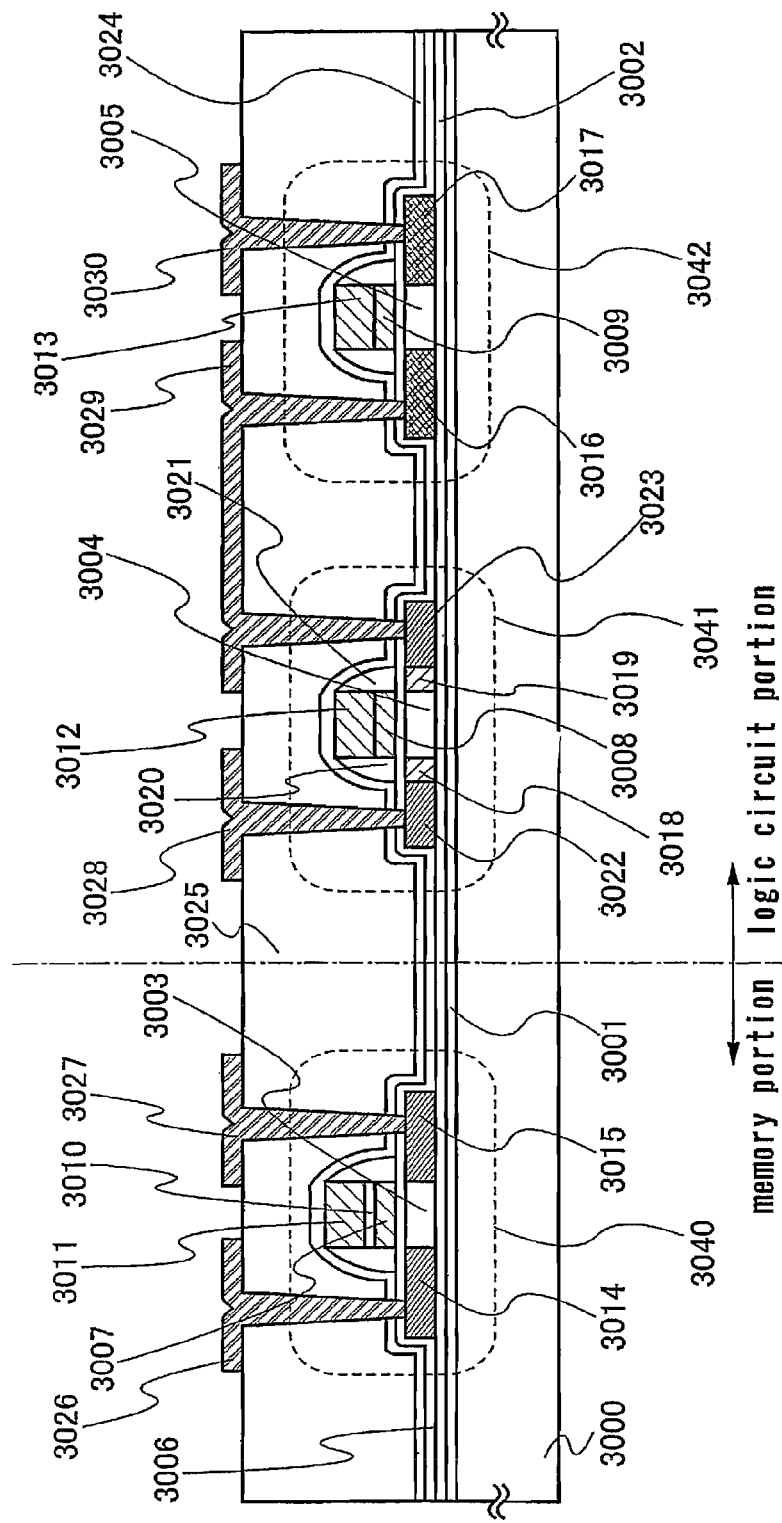
FIG. 13 is a diagram showing an example of a manufacturing method of a semiconductor device of the invention.

In this manner, a memory portion including an N-channel type memory element 3040 including a floating gate, and a logic circuit portion including an N-channel type TFT 3041 with an LDD structure and a P-channel type TFT 3042 with a single drain structure, can be formed over the same substrate (FIG. 13).

This embodiment mode can be implemented freely combining with the above-described Embodiment Modes 1 to 4.

[Embodiment Mode 6]

In this embodiment mode, a semiconductor device of the invention, of which the structure is different from the above-described embodiment modes, will be described with reference to drawings. Specifically, a memory element provided in the semiconductor device will be described.

Figure 14:
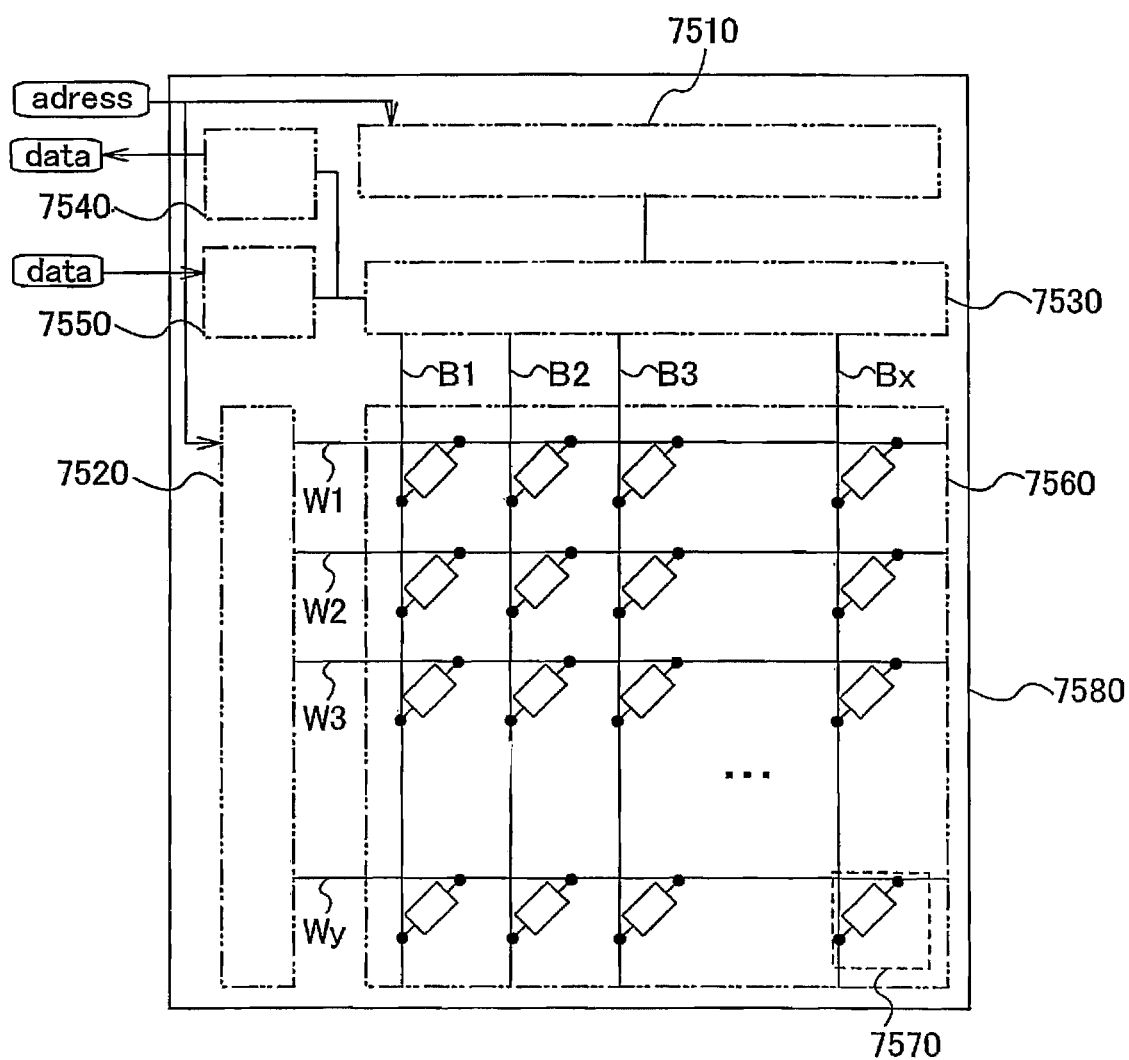
FIG. 14 is a diagram showing an example of a semiconductor device of the invention.

As shown in FIG. 14, a memory portion 7580 includes a memory cell array 7560 in which memory elements are formed, and a driver circuit. The driver circuit includes a column decoder 7510, a row decoder 7520, a reading circuit 7540, a writing circuit 7550, and a selector 7530.

The memory cell array 7560 includes a bit line Bm (m=1 to x), a word line Wn (n=1 to y), and a memory cell 7570 each at an intersection of the bit line and the word line. It is to be noted that the memory cell 7570 may be either an active type in which a transistor is connected or a passive type which is constituted only by a passive element. In the case of a passive type, the memory element portion is formed by providing a memory element between a conductive film structuring a bit line and a conductive film structuring a word line, in the memory cell 7570. In addition, the bit line Bm is controlled by, the selector 7530, and the word line Wn is controlled by the row decoder 7520.

The column decoder 7510 receives an address signal for specifying an arbitrary bit line and supplies a signal to the selector 7530. The selector 7530 receives the signal of the column decoder 7510 to select the specified bit line. The row decoder 7520 receives an address signal for specifying an arbitrary word line to select the specified word line. According to the above operation, one memory cell 7570 corresponding to the address signal is selected. The reading circuit 7540 reads data included in the selected memory cell and outputs it. The writing circuit 7550 generates a voltage required for writing, and applies the voltage to the selected memory cell, thereby data writing is performed.

Next, a circuit configuration of the memory cell 7570 will be described. In this embodiment mode, description is made on a memory cell including a memory element 7830 in which a lower electrode and an upper electrode are provided and a memory material layer is interposed between the pair of electrodes.

Figure 15A:
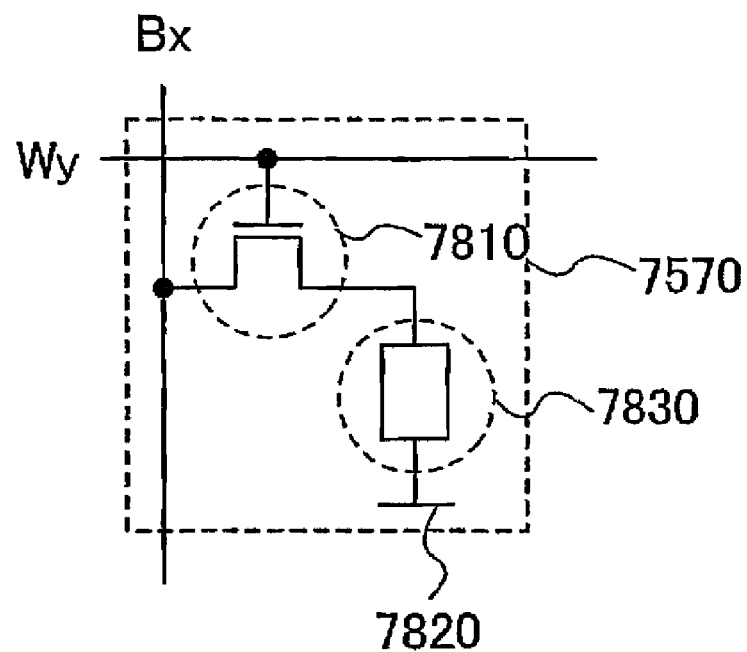
FIGS. 15A and 15B are diagrams each showing an example of a semiconductor device of the invention.

The memory cell 7570 shown in FIG. 15A is an active memory cell including a transistor 7810 and the memory element 7830. As the transistor 7810, a thin film transistor can be used, for example. A gate electrode of the transistor 7810 is connected to a word line Wy. In addition, one of a source electrode and a drain electrode of the transistor 7810 is connected to a bit line Bx while the other thereof is connected to the memory element 7830. The lower electrode of the memory element 7830 is electrically connected to the one of the source electrode and the drain electrode of the transistor 7810. In addition, the upper electrode (corresponds to reference numeral 7820) of the memory element 7830 can be shared between the memory elements, as a common electrode.

Figure 15B:
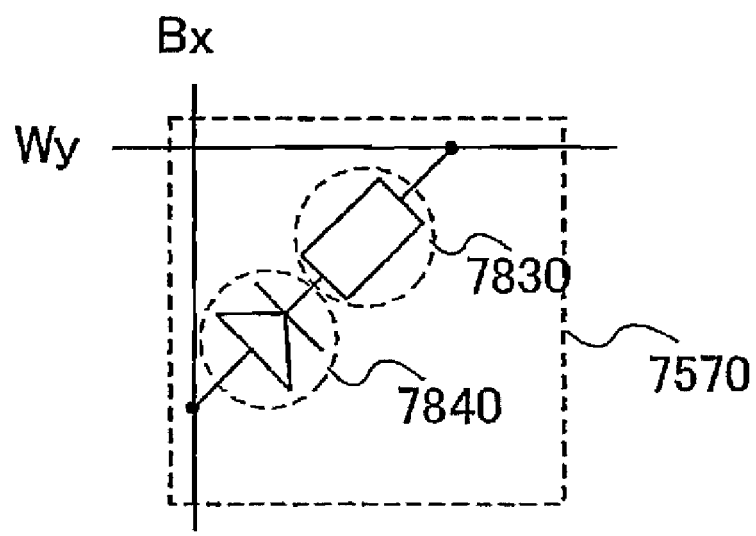

In addition, a configuration as shown in FIG. 15B, in which the memory element 7830 is connected to a diode 7840 may be used as well. The diode 7840 can adopt a so-called diode connection structure in which one of a source electrode and a drain electrode of a transistor is connected to a gate electrode thereof. Furthermore, as the diode 7840, a Schottky diode which uses contact between a memory material layer and a lower electrode may also be used, or a diode formed of a laminated layer of a memory material may also be used.

For the memory material layer, a material of which property or state changes by electrical action, optical action, thermal action, or the like can be used. For example, a material of which property or state changes by dissolution, dielectric breakdown or the like due to Joule heat so that the upper electrode and the lower electrode can be short-circuited, may be used. Thus, the thickness of the memory material layer may be 5 to 100 nm, and preferably 10 to 60 nm. For such a memory material layer, an inorganic material or an organic material can be used and it can be formed by an evaporation method, a spin-coating method, a droplet discharging method, or the like.

As the inorganic material, there are silicon oxide, silicon nitride, silicon oxynitride, or the like. Even in the case of such an inorganic material, a dielectric breakdown is caused by controlling a film thickness thereof, so that the upper electrode and the lower electrode can be short-circuited.

As the organic material, for example, an aromatic amine based (in other words, including a benzene ring-nitrogen bond) compound such as 4,4'-bis[N-(1-naphthyl)-N-phenylamino]-biphenyl (abbreviated: α-NPD), 4,4'-bis[N-(3-methylphenyl)-N-phenyl-amino]-biphenyl (abbreviated: TPD), 4,4'4"-tris(N,N-diphenyl-amino)-triphenylamine (abbreviated: TDATA), 4,4'4"-tris[N-(3-methylphenyl)-N-phenylamino]-triphenylamine (abbreviated: MTDATA), and 4,4'-bis(N-(4-(N,N-di-m-tolylamino)phenyl)-N-phenylamino) biphenyl (abbreviated: DNTPD); polyvinylcarbazole (abbreviated: PVK); phthalocyanine (abbreviated: $H_2Pc$); or a phthalocyanine compound such as copper phthalocyanine (abbreviated: CuPc) or vanadyl phthalocyanine (abbreviated: VOPc) can be used. These materials have high hole transporting properties.

In addition, as the organic material, for example, a material formed from a metal complex or the like having a quinoline skeleton or a benzoquinoline skeleton, such as tris(8-quinolinolato)aluminum (abbreviated: $Alq_3$), tris(4-methyl-8-quinolinolato)aluminum (abbreviated: $Almq_3$), bis(10-hydroxybenzo[h]quinolinato)beryllium (abbreviated: $BeBq_2$), or bis(2-methyl-8-quinolinolato)-4-phenylphenolato-aluminum (abbreviated: BAlq); or a metal complex having a oxazole-based ligand or a thiazole-based ligand, such as bis [2-(2-hydroxyphenyl)benzoxazolato]zinc (abbreviated: $Zn(BOX)_2$) or bis[2-(2-hydroxyphenyl)benzothiazolato]zinc (abbreviated: $Zn(BTZ)_2$), can also be used. These materials have high electron transporting properties.

Furthermore, other than the metal complex, a compound such as 2-(4-biphenylyl)-5-(4-tert-butylphenyl)-1,3,4-oxadiazole (abbreviated: PBD); 1,3-bis[5-(p-tert-buthylphenyl)-1,3,4-oxadiazol-2-yl]benzene (abbreviated: OXD-7); 3-(4-tert-buthylphenyl)-4-phenyl-5-(4-biphenylyl)-1,2,4-triazole (abbreviated: TAZ); 3-(4-tert-buthylphenyl)-4-(4-ethylphenyl)-5-(4-biphenylyl)-1,2,4-triazole (abbreviated: p-EtTAZ); bathophenanthroline (abbreviated: BPhen); or bathocuproin (abbreviated: BCP), or the like can be used.

In addition, the memory material layer may be formed of a single layer structure or a laminated layer structure. In the case of the laminated layer structure, with the material selected above, the laminated layer structure can be formed. In addition, the above organic material and a light-emitting material may also be laminated. As the light-emitting material, there are 4-dicyanomethylene-2-methyl-6-(1,1,7,7-tetramethyljulolidil-9-enyl)-4H-pyran (abbreviated: DCJT); 4-dicianomethylene-2-t-butyl-6-(1,1,7,7-tetramethyljulolidil-9-enyl)-4H-pyran; periflanthene; 2,5-dicyano-1,4-bis(10-methoxy-1,1,7,7-tetramethyljulolidil-9-enyl)benzene; N,N'-dimethylquinacridone (abbreviated: DMQd); coumarin 6; coumarin 545T; tris(8-quinolinolato)aluminum (abbreviated: $Alq_3$); 9,9'-bianthryl; 9,10-diphenylanthracene (abbreviated: DPA); 9,10-bis(2-naphthyl)anthracene (abbreviated: DNA); 2,5,8,11-tetra-t-butylperylene (abbreviated: TBP), or the like.

Further, a layer in which the above light-emitting material is dispersed may also be used. In the layer in which the above light-emitting material is dispersed, as a mother material, an anthracene derivative such as 9,10-di(2-naphthyl)-2-tent-butylanthracene (abbreviated: t-BuDNA); a carbazole derivative such as 4,4'-bis(N-carbazolyl)biphenyl (abbreviated: CBP); a metal complex such as bis[2-(2-hydroxyphenyl)pyridinato]zinc (abbreviated: $Znpp_2$) or bis[2-(2-hydroxyphenyl)benzoxazolato]zinc (abbreviated: ZnBOX); or the like can be used. In addition, tris(8-quinolinolato)aluminum (abbreviated: $Alq_3$); 9,10-bis (2-naphthylanthracene (abbreviated: DNA); bis(2-methyl-8-quinolinolato)-4-phenylphenolato-aluminum (abbreviated: BAlq); or the like can be used.

The glass-transition temperature (Tg) of such an organic material may be 50 to 300° C., and preferably 80 to 120° C. in order to change its property by thermal action, or the like.

In addition, a material in which a metal oxide is mixed with the above organic material or light-emitting material may also be used. It is to be noted that the material mixed with a metal oxide includes a state in which the above organic material or light-emitting material and the metal oxide are mixed or a state in which they are laminated. Specifically, it indicates a state which is formed by a co-evaporation method using a plurality of evaporation sources. Such a material can be called an organic-inorganic composite material.

For example, in a case of mixing a material having a high hole transporting property with a metal oxide, a vanadium oxide, a molybdenum oxide, a niobium oxide, a rhenium oxide, a tungsten oxide, a ruthenium oxide, a titanium oxide, a chromium oxide, a zirconium oxide, a hafnium oxide, or a tantalum oxide is preferably used as the metal oxide.

In a case of mixing a material having a high electron transporting property with a metal oxide, a lithium oxide, a calcium oxide, a sodium oxide, a kalium oxide or a magnesium oxide is preferably used as the metal oxide.

Also, for the memory material layer, since a material of which property or state changes by electrical action, optical action, thermal action, or the like may be used; a conjugated polymer in which a compound (photoacid generator) generating acidum by absorbing light is added, can also be used, for example. As the conjugated polymer, one kind of polyacetylene, one kind of polyphenylenevinylene, one kind of polythiophene, one kind of polyaniline, one kind of polyphenylene ethynylene, or the like can be used. In addition, as the photoacid generator, arylsulfonium salt, aryliodonium salt, o-nitrobenzyltosylate, arylsulfonic acid-p-nitrobenzylester, one kind of sulfonylacetophenone, Fe-arene complex PF6 salt, or the like can be used.

Next, an operation when data writing is performed to the active memory cell 7570 as shown in FIG. 15A will be described. It is to be noted that in this embodiment mode, a value stored in the memory element in an initial state is "0" and a value stored in the memory element with the property changed by electrical action or the lice is "1". In addition, the resistance is high in the memory element with the initial state and the resistance is low in the memory element after change.

When writing is performed, the bit line Bm of the m-th column and the word line Wn of the n-th row are selected by the column decoder 7510, the row decoder 7520, and the selector 7530, and the transistor 7810 included in the memory cell 7570 in the m-th column and the n-th row is turned on.

Subsequently, from the writing circuit 7550, a predetermined voltage is applied to the bit line Bm of the m-th column for a predetermined period. For this voltage and period to be applied, such condition that the memory element 7830 changes from the initial state to the state in which the resistance is low, is employed. The voltage applied to the bit line Bm of the m-th column is transmitted to the lower electrode of the memory element 7830 so that a potential difference occurs between the lower electrode and the upper electrode. Therefore, current flows through the memory element 7830 and there occurs a change in the state of the memory material layer so that the memory element property is changed. Then, the value stored in the memory element 7830 is changed from "0" to "1".

Figure 16:
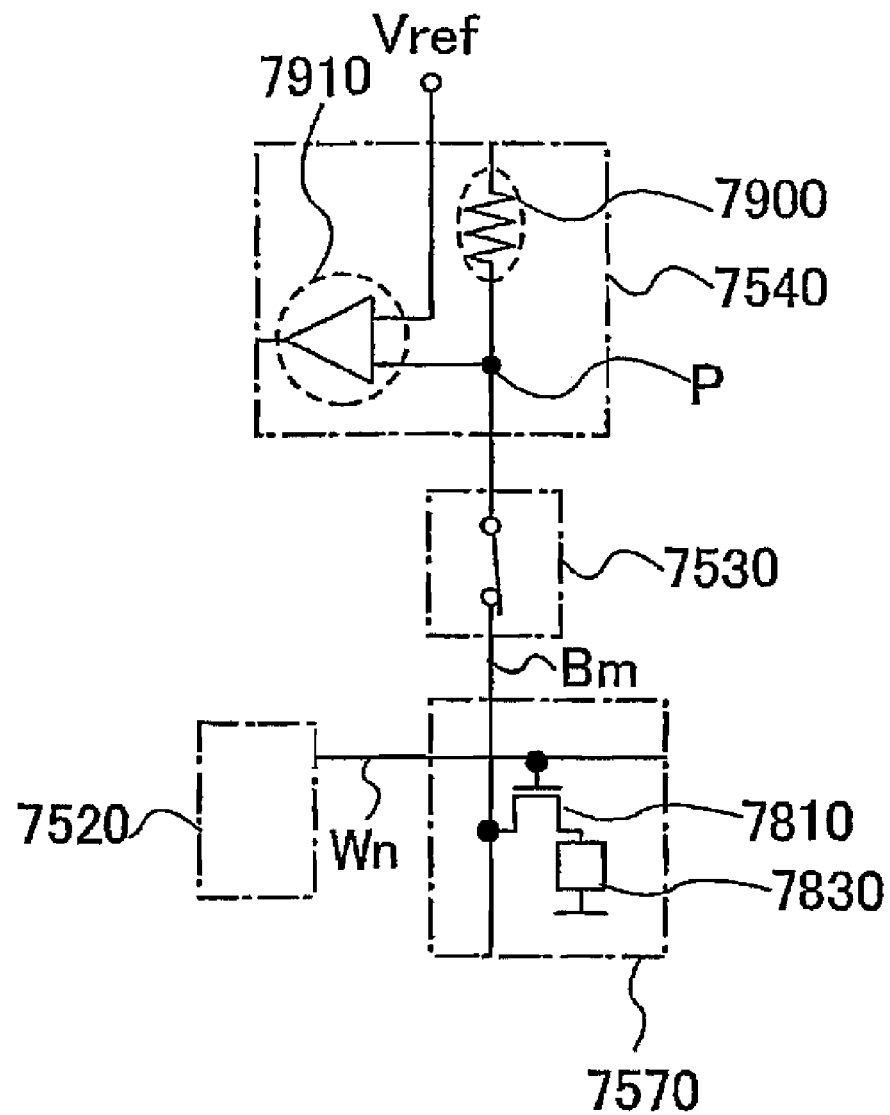
FIG. 16 is a diagram showing an example of a semiconductor device of the invention.

Next, an operation of data reading will be described. As shown in FIG. 16, the reading circuit 7540 includes a resistor 7900 and a sense amplifier 7910. For performing the data reading, a voltage is applied between the lower electrode and the upper electrode and whether the memory element is the initial state or the state in which the resistance is low after change is judged. Specifically, data reading can be performed by a resistance-dividing method.

For example, the case of performing data reading of the memory element 7830 in the m-th column and the n-th row among a plurality of the memory elements 7830 included in the memory cell array 7560, will be described. First, the bit line Bm of the m-th column and the word line Wn of the n-th row are selected by the column decoder 7510, the row decoder 7520, and the selector 7530. Therefore, the transistor 7810 included in the memory cell 7570 arranged in the m-th column and the n-th row is turned on so that the memory element 7830 and the resistor 7900 are connected in series. As a result of this, a potential at a point P shown in FIG. 16 is determined depending on the current characteristic of the memory element 7830.

When the potential of the point P in the case where the memory element is in the initial state is V1 and the potential of the point P in the case where the memory element is in the low-resistance state after change is V2, data stored in the memory element can be read out by using a reference potential Vref which satisfies V1>Vref>V2. Specifically, in the case where the memory element is in the initial state, an output potential of the sense amplifier 7910 becomes Lo and in the case where the memory element is in the low-resistance state, the output potential of the sense amplifier 7910 becomes Hi.

According to the above-described method, data is read out by a voltage value by using the difference of the resistance and resistance division of the memory element 7830; however, the data of the memory element 7830 may also be read out by a current value. It is to be noted that the reading circuit 7540 of the invention is not limited to the above configuration, and may have any configuration as long as data stored in a memory element can be read out.

The memory element having such a configuration changes its state from "0" to "1". The change from the "0" state to the "1" state is irreversible, thus, the memory element is a write-once memory element. Therefore, forgery made by a third party by rewriting information from outside can be prevented.

Initial data can be written to such a memory element 7830, and besides, data from the sensor device can be written sequentially. Then, the written data can be read out by wireless communication.

Figure 17A:
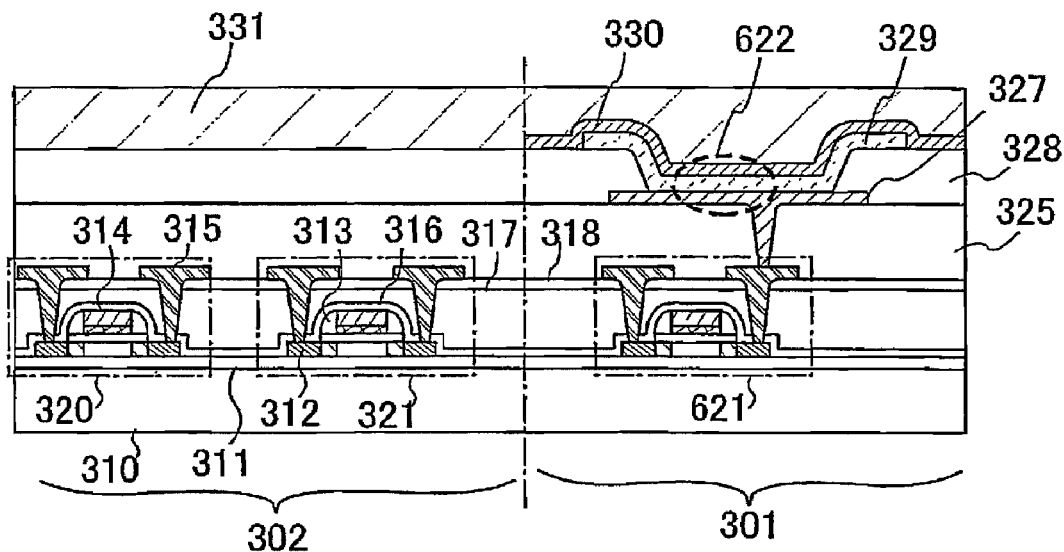
FIGS. 17A and 17B are diagrams each showing an example of a semiconductor device of the invention.

Next, a cross-sectional diagram of a memory element in which a memory cell portion 301 and a driver circuit portion 302 are integrally formed over an insulating substrate 310 is shown (FIG. 17A).

A base film 311 is formed over the insulating substrate 310. In the driver circuit portion 302, thin film transistors 320 and 321 are provided over the base film 311, and in the memory cell portion 301, a thin film transistor 621 is provided over the base film 311. Each thin film transistor is provided with a semiconductor film 312 which is etched into an island-shape, a gate electrode 314 provided with a gate insulating film therebetween, and an insulator (a so-called side wall) 313 provided on side surfaces of the gate electrode. The semiconductor film 312 is formed with a thickness of 0.2 μm or less, typically a thickness of 40 nm or more and 170 nm or less, and preferably a thickness of 50 nm or more and 150 nm or less. Further, an insulating film 316 covering the side wall 313 and the semiconductor film 312, and an electrode 315 which is connected to an impurity region formed in the semiconductor film 312 are included. The electrode 315 which is connected to the impurity region can be formed in the following manner: a contact hole is formed in the gate insulating film and the insulating film 316; a conductive film is formed in the contact hole; and the conductive film is selectively etched. As the insulating substrate 310, a glass substrate, a quartz substrate, a substrate formed of silicon, a metal substrate, or the like can be used.

In order to improve the flatness, insulating films 317 and 318 may be provided. In that case, the insulating film 317 may be formed of an organic material, and the insulating film 318 may be formed of an inorganic material. In the case where the insulating films 317 and 318 are provided, the electrode 315 can be formed in these insulating films 317 and 318 so as to be connected to the impurity region through a contact hole.

Furthermore, an insulating film 325 is provided, and a lower electrode 327 is formed so as to be connected to the electrode 315. An insulating film 328 provided with an opening so as to cover end portions of the lower electrode 327 and expose the lower electrode 327 is formed. Inside the opening, a memory material layer 329 is formed and an upper electrode 330 is formed. In this manner, the memory element 622 including the lower electrode 327, the memory material layer 329, and the upper electrode 330 can be formed. The memory material layer 329 can be formed of an organic material or an inorganic material. The lower electrode 327 or the upper electrode 330 can be formed of a conductive material. For example, a film formed of an element of aluminum (Al), titanium (Ti), molybdenum (Mo), tungsten (W), or silicon (Si), an alloy film using the above-described element, or the like can be used. Furthermore, a light-transmitting material such as indium tin oxide (ITO), indium tin oxide containing silicon oxide, or indium oxide containing zinc oxide of 2% or more and 20% or less can also be used.

In order to improve flatness further and prevent an impurity element from entering, an insulating film 331 may be formed.

For the insulating film described in this embodiment mode, an inorganic material or an organic material can be used. As the inorganic material, silicon oxide or silicon nitride can be used. As the organic material, polyimide, acrylic, polyamide, polyimidamide, resist or benzocyclobutene, siloxane, or polysilazane can be used. It is to be noted that a siloxane resin corresponds to a resin containing an Si—O—Si bond. Siloxane includes a skeleton formed by the bond of silicon (Si) and oxygen (O), and an organic group containing at least hydrogen (such as an alkyl group or aromatic hydrocarbon) is used as a substituent. Alternatively, a fluoro group may be used as the substituent. Further alternatively, an organic group containing at least hydrogen, and a fluoro group may be used. Polysilazane is formed by using a polymer material having the bond of silicon (Si) and nitrogen (N) as a starting material.

Figure 17B:
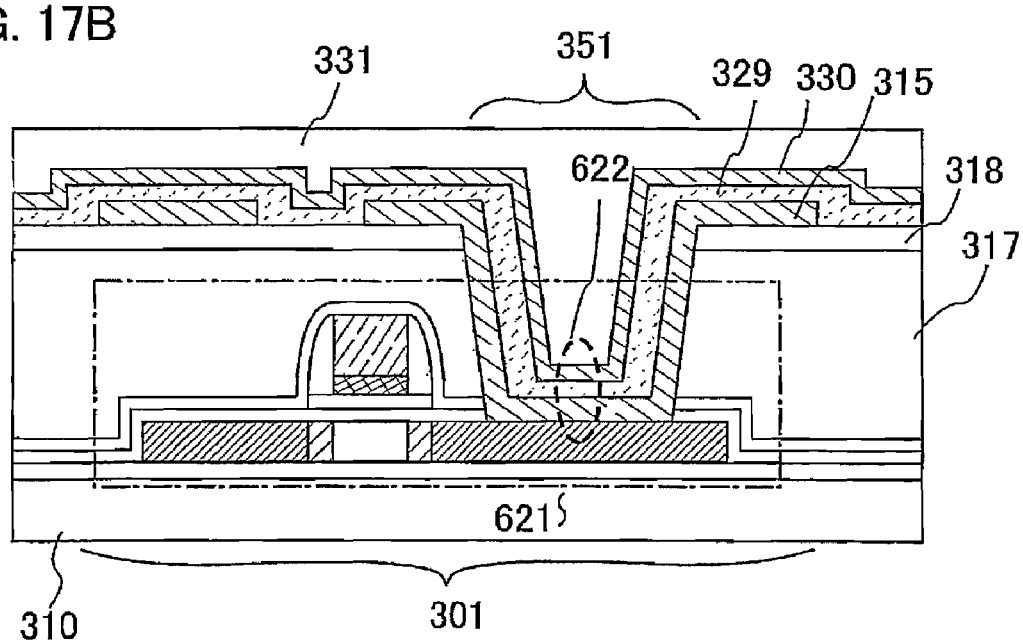

FIG. 17B is a cross-sectional diagram of a memory element which is different from FIG. 17A, in which the memory material layer is formed within a contact hole 351 of the electrode 315. Similarly to FIG. 17A, the electrode 315 is used as the lower electrode, and the memory material layer 329 and the upper electrode 330 are formed over the electrode 315 to form the memory element 622. After that, the insulating film 331 is formed. The other configuration is the same as FIG. 17A, thus description thereof is omitted herein.

By forming the memory element in the contact hole 351, miniaturization of a memory portion can be achieved. Furthermore, since an electrode for a memory is not required, the number of manufacturing steps is reduced and a memory device at low cost can be provided.

This embodiment mode can be implemented freely combining with the above-described Embodiment Modes 1 to 5.

[Embodiment Mode 7]

In this embodiment mode, a usage pattern of a semiconductor device of the invention will be described with reference to FIGS. 18A to 18C.

Figure 18A:
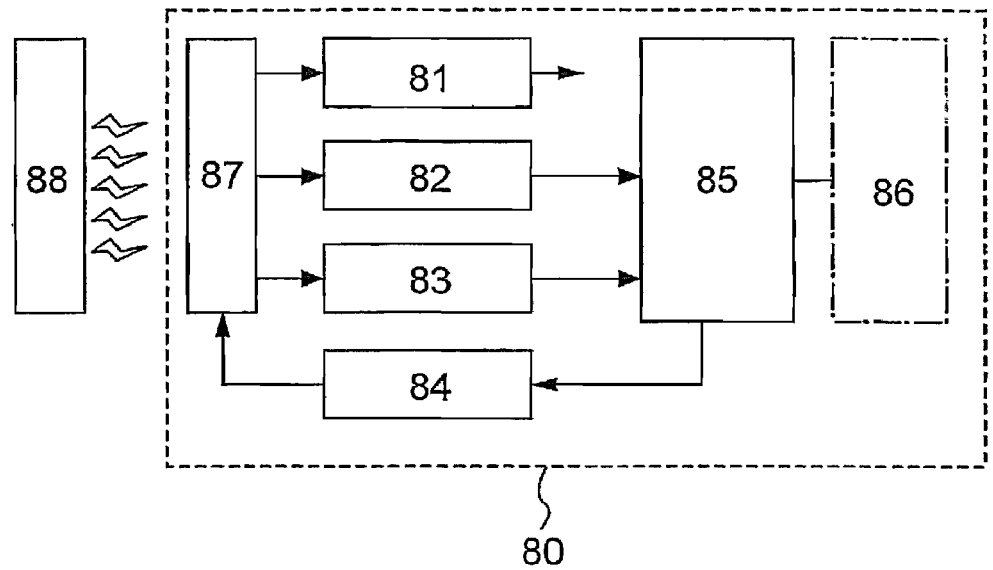
FIGS. 18A to 18C are diagrams each showing an example of a usage pattern of a semiconductor device of the invention.
Figure 18B:
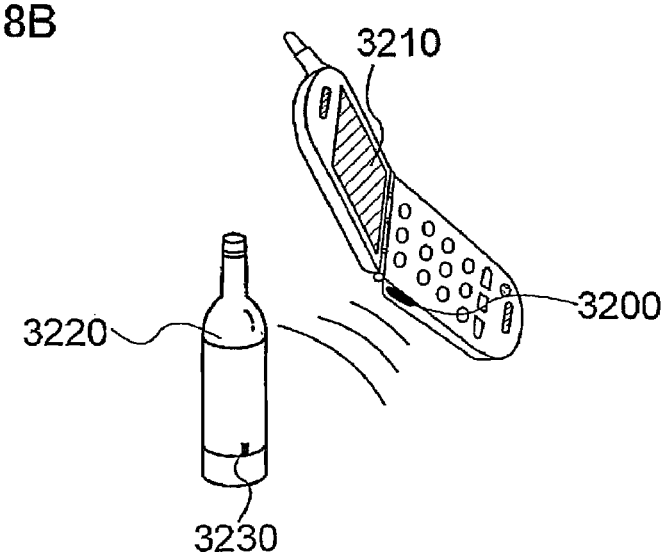
Figure 18C:
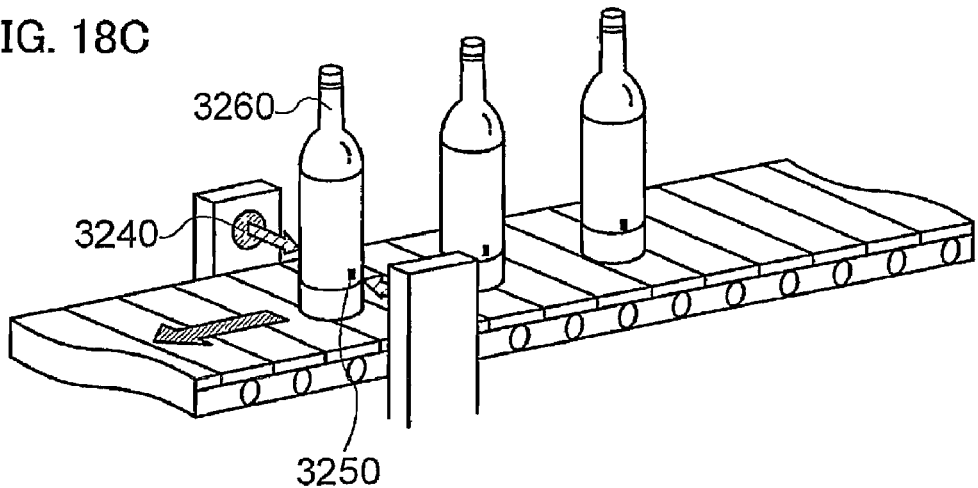

A semiconductor device 80 has a function of communicating data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 18A). It is to be noted that the number of memory circuits is not limited to one, and a plurality of memory circuits may be provided. As the memory circuit, an SRAM, a flash memory, a ROM, an FeRAM or the like, or a memory having a memory element portion formed of the organic compound layer described in the above-described embodiment mode, may be used.

A signal transmitted as an electromagnetic wave from a reader/writer 88 is converted into an AC electrical signal in an antenna 87 by electromagnetic induction. In the Dower supply circuit 81, a power supply voltage is generated using an AC electrical signal, and the power supply voltage is supplied to each circuit using a power supply wire. In the clock generation circuit 82, various clock signals are generated based on an AC signal input from the antenna 87, and the signals are supplied to the control circuit 85. In the data demodulation circuit 83, an AC electrical signal is demodulated and supplied to the control circuit 85. In the control circuit 85, various arithmetic operations are performed in accordance with the input signals. The memory circuit 86 stores programs, data and the like that are used in the control circuit 85, and functions as a work area for arithmetic operations. Then, data is transmitted from the control circuit 85 to the data modulation circuit 84, and load modulation of the antenna 87 can be achieved by means of the data transmitted from the data modulation circuit 84. The reader/writer 88 receives load modulation of the antenna 87 as electromagnetic waves, thereby reads data.

Alternatively, the semiconductor device may be a type of supplying a power supply voltage to each circuit by an electric wave, without mounting a power source (battery), or may be a type of supplying a power supply voltage to each circuit by an electric wave and a power source (battery), mounting a power source (battery).

A semiconductor device of the present invention has advantages such as: non-contact communication is possible; multiple reading is possible; writing data is possible; and processing into various shapes is possible; directivity is wide and a wide recognition range is provided depending on the selected frequency. A semiconductor device of the invention can be applied to an IC tag which can identify individual information of a person or a thing in non-contact wireless communication, a label which can be attached to an article by label processing, a wristband for an event or an amusement, or the like. In addition, the semiconductor device may be processed with a resin material and may be directly fixed to a metal obstructing wireless communication. Furthermore, a semiconductor device of the invention can be utilized for operating a system such as an entering-leaving management system or a checkout system.

Next, one mode of the actual use of the semiconductor device which can exchange data without contact will be described. A reader/writer 3200 is provided on the side of a portable terminal including a display portion 3210, and a semiconductor device 3230 is provided on the side of an article 3220 (FIG. 18B). When the reader/writer 3200 is held against the semiconductor device 3230 included in the article 3220, information relating to a product, such as a raw material and a place of origin of the article, a test result in each production process, a history of distribution process, or further, description of the product is displayed in the display portion 3210. In addition, a product 3260 can be inspected by using a reader/writer 3200 and a semiconductor device 3250 provided on the product 3260 when the product 3260 is transported with a belt conveyor (FIG. 18C). In this manner, information can be easily obtained, and high functions and high added values are realized by utilizing a semiconductor device for a system.

This embodiment mode can be implemented freely combining with the above-described Embodiment Modes 1 to 6.
[Embodiment Mode 8]

The application range of a semiconductor device of the invention is so wide that it may be applied to any object in order that the history thereof is revealed without contact and utilized in production, management and the like. For example, the semiconductor device of the invention may be incorporated in bills, coins, securities, certificates, bearer bonds, containers for packages, books, recording media, personal belongings, vehicles, foods, clothes, healthcare items, livingware, medicals, and electronic apparatuses. Examples of these objects will be described with reference to FIGS. 19A to 19H.

Figure 19A:
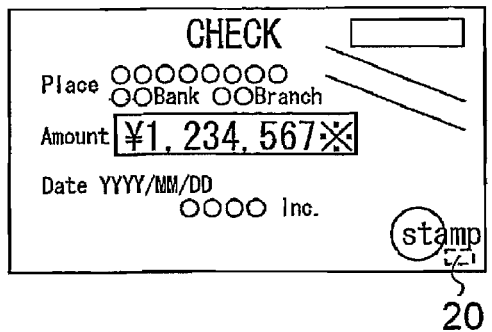
FIGS. 19A to 19H are diagrams each showing an example of a usage pattern of a semiconductor device of the invention.
Figure 19B:
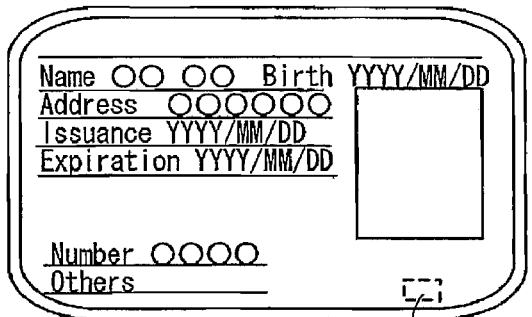
Figure 19C:
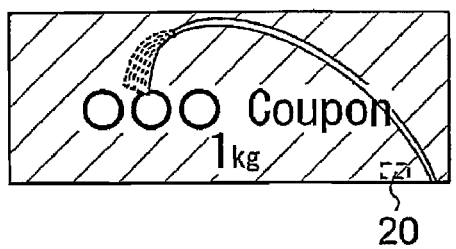
Figure 19D:
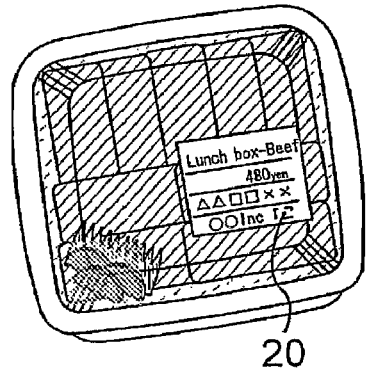
Figure 19E:
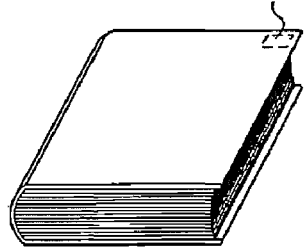
Figure 19F:
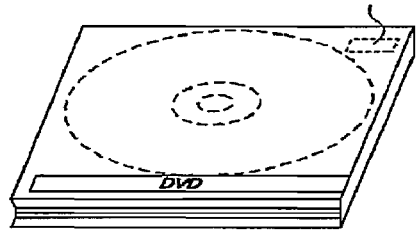
Figure 19G:
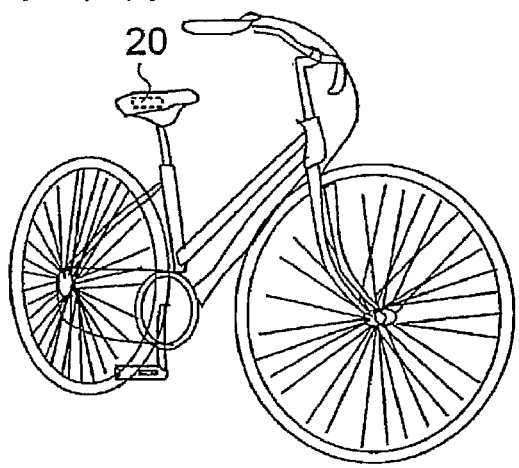
Figure 19H:
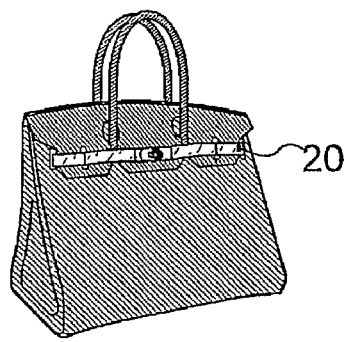

The bills and coins include currency in the market and include a note that is in currency in a specific area as money (cash voucher), memorial coins, and the like. The securities include a check, a certificate, a promissory note, and the like (FIG. 19A). The certificates include a driving license, a resident card, and the like (FIG. 19B). The bearer bonds include a stamp, a rice coupon, various gift coupons, and the like (FIG. 19C). The containers for packages include paper for packing a box lunch or the like, a plastic bottle, and the like (FIG. 19D). The books include a document and the like (FIG. 19E). The recording media include DVD software, a video tape, and the like (FIG. 19F). The vehicles include a wheeled vehicle such as a bicycle, a vessel, and the like (FIG. 19G). The personal belongings include a bag, glasses, and the like (FIG. 19H). The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic apparatuses include a liquid crystal display device, an EL display device, a television set (a television receiver, a thin television receiver), a mobile phone, and the like.

When the semiconductor device described in the above embodiment modes is incorporated in bills, coins, securities, certificates, bearer bonds, and the like, forgery of them can be prevented. When the semiconductor device described in the above embodiment modes is incorporated in containers for packages, books, recording media, personal belongings, foods, livingware, electronic apparatuses, and the like, inspection systems, rental systems and the like can be performed more efficiently. When the semiconductor device described in the above embodiment modes is incorporated in vehicles, healthcare items, medicals, and the like, forgery and theft of them can be prevented and medicines can be prevented from being consumed in the wrong manner. A semiconductor device may be attached to the surface of a product or incorporated into a product. For example, a semiconductor device may be incorporated into the paper of a book, or an organic resin of a package. If data is written (rewritten) by an optical effect afterward, a transparent material is preferably used so that a memory element provided in a chip is irradiated with light. Furthermore, forgery can be effectively prevented by using a memory element where data cannot be rewritten. Problems such as privacy after a user purchases a product can be solved by providing a system for erasing data of a memory element provided in a semiconductor device.

In this manner, when the semiconductor device described in the above embodiment modes is incorporated in containers for packages, recording media, foods, clothes, livingware, electronic apparatuses, and the like, inspection system, rental system and the like can be performed more efficiently. The semiconductor device described in the above embodiment modes also prevents vehicles from being forged or stolen. In addition, when the semiconductor device described in the above embodiment modes is implanted into creatures such as animals, each creature can be identified easily. For example, when the semiconductor device described in the above embodiment modes provided with a sensor is implanted into creatures such as domestic animals, not only the year of birth, sex, breed and the like but also the health condition such as the current body temperature can be easily controlled. Furthermore, by controlling the communication range of the semiconductor device short, information is prevented from being looked secretly by a third party.

As described above, a semiconductor device of the invention can be incorporated in any object. This embodiment mode can be implemented freely combining with the above-descried Embodiment Modes 1 to 7.

This application is based on Japanese Patent Application serial no. 2005-160735 filed in Japan Patent Office on May, 31st, in 2005, the entire contents of which are hereby incorporated by reference.

Explanation of Reference

80: semiconductor device, 81: power supply circuit, 82: clock generation circuit, 83: demodulation circuit, 84: modulation circuit, 85: control circuit, 86: memory circuit, 87: antenna., 88: reader/writer, 301: memory cell portion, 302: driver circuit portion, 310: insulating substrate, 311: base film, 312: semiconductor film, 313: side wall, 314: gate electrode, 315: electrode, 316: insulating film, 317: insulating film, 318: insulating film, 320: thin film transistor, 325: insulating film, 327: lower electrode, 328: insulating film, 329: memory material layer, 330: upper electrode, 331: insulating film, 351: contact hole, 401: substrate, 402: element group, 403: conductive film, 404: conductive film, 406: insulating film, 407: conductive film, 409: transistor, 410: switching means, 420: switching means, 421: end portion, 621: thin film transistor, 701: substrate, 702: peeling layer: 703: insulating film, 704: amorphous semiconductor film, 705: gate insulating film, 706: crystalline semiconductor film, 707: crystalline semiconductor film, 711: N-type impurity region, 712: P-type impurity region, 716: conductive film, 726: N-type impurity region, 727: N-type impurity region, 734: insulating film, 739: insulating film, 744: thin film transistor, 745: thin film transistor, 749: insulating film, 750: insulating film, 751: insulating film, 752: conductive film, 762: insulating film, 765: conductive film, 767: conductive film, 772: insulating film: 773: opening, 775: sheet material, 776: sheet material, 777: sheet material, 780: channel forming region, 781: channel forming region: 783: memory element, 785: P-type impurity region, 786: conductive film, 789: memory element portion, 791: element forming layer, 802: opening, 805: squeegee, 806: paste, 3000: glass substrate, 3001: base film, 3002: base film, 3003: semiconductor layer, 3003: semiconductor layer, 3006: gate insulating film, 3007: conductive layer, 3010: gate insulating film, 3011: conductive layer, 3014: impurity region, 3016: impurity region, 3018: impurity region, 3020: side wall, 3022: impurity region, 3024: interlayer insulating film, 3025: interlayer insulating film, 3026: electrode, 3028: electrode, 3200: reader/writer, 3210: display portion, 3220: merchandise, 3230: semiconductor device, 3250: semiconductor device, 3260: commercial product, 405a: end portion, 405b: end portion, 410a: transistor, 7510: column decoder, 7520: row decoder, 7530: selector, 7540: circuit, 7550: circuit, 7560: memory cell array, 7570: memory cell, 7580: memory portion, 766a: conductive film, 7810:

transistor, 7830: memory element, 7840: diode, 7900: resistance element, 7910: sense amplifier

What is claimed is:
1. A, semiconductor device comprising:
a substrate;
an element group comprising a plurality of transistors provided in the substrate;
a first conductive film functioning as an antenna above the element group;
a second conductive film having a first end portion and a second end portion, surrounding the first conductive film; and
a third conductive film covering the first end portion of the second conductive film and the second end portion of the second conductive film through an insulating film,
wherein the first conductive film is provided in the shape of a coil and each of end portions of the first conductive film is connected to the element group; and
wherein the first end portion of the second conductive film and the second end portion of the second conductive film are insulated.

2. The semiconductor device according to claim 1, wherein the plurality of transistors are thin film transistors.

3. The semiconductor device according to claim 1, wherein the element group comprises a nonvolatile memory.

4. The semiconductor device according to claim 3, wherein the nonvolatile memory comprises:
a plurality of bit lines extended in a first direction and a plurality of word lines extended in a second direction perpendicular to the first direction;
a memory cell array comprising a plurality of the memory cells, each of the plurality of the memory cell having a memory element,
wherein the memory element comprises an organic compound layer between a conductive layer structuring the bit line and a conductive layer structuring the word line.

* * * * *